United States Patent
Armstrong et al.

(10) Patent No.: US 9,538,671 B2
(45) Date of Patent: Jan. 3, 2017

(54) SYSTEM FOR HOUSING AND POWERING A BATTERY-OPERATED DEVICE AND ASSOCIATED METHODS

(71) Applicant: Ascent Solar Technologies, Inc., Thornton, CO (US)

(72) Inventors: Joseph H. Armstrong, Littleton, CO (US); Robert Meck, Fort Collins, CO (US)

(73) Assignee: ASCENT SOLAR TECHNOLOGIES, INC., Thornton, CO (US)

(*) Notice: Subject to any disclaimer, the term of this patent is extended or adjusted under 35 U.S.C. 154(b) by 0 days.

(21) Appl. No.: 13/802,713

(22) Filed: Mar. 14, 2013

(65) Prior Publication Data

US 2014/0168866 A1    Jun. 19, 2014

Related U.S. Application Data

(60) Provisional application No. 61/737,656, filed on Dec. 14, 2012.

(51) Int. Cl.
| | |
|---|---|
| *H02J 7/00* | (2006.01) |
| *H05K 7/00* | (2006.01) |
| *H05K 5/00* | (2006.01) |
| *G06F 1/16* | (2006.01) |
| *H02J 7/35* | (2006.01) |

(52) U.S. Cl.
CPC ........... *H05K 5/0021* (2013.01); *G06F 1/1632* (2013.01); *H02J 7/0044* (2013.01); *H02J 7/35* (2013.01); *G06F 2200/1633* (2013.01); *Y02E 10/566* (2013.01)

(58) Field of Classification Search
CPC ..................................................... H02J 7/0044

USPC ................... 320/114; 361/679.01; 455/575.8
See application file for complete search history.

(56) References Cited

U.S. PATENT DOCUMENTS

| | | | |
|---|---|---|---|
| 6,650,031 B1 | 11/2003 | Goldack | |
| D650,810 S | 12/2011 | Lemelman et al. | |
| D651,167 S | 12/2011 | Lemelman et al. | |
| D654,931 S | 2/2012 | Lemelman et al. | |
| D662,044 S | 6/2012 | Lemelman et al. | |

(Continued)

FOREIGN PATENT DOCUMENTS

KR          200437848 Y1      1/2008

OTHER PUBLICATIONS

Amazon.com, "Boostcase Hybrid Snap Case and Detachable Extended Battery for iPhone," accessed from Internet on Sep. 26, 2012, 6 pages.

(Continued)

*Primary Examiner* — Richard Isla Rodas
*Assistant Examiner* — Johali Torres Ruiz
(74) *Attorney, Agent, or Firm* — Lathrop & Gage LLP

(57) ABSTRACT

A reversible system for housing a battery-operated device includes a first case member and a second case member. The first case member includes a first alignment member and the second case member includes a second alignment member complimenting the first alignment member such that the orientation of the first case member to the second case member can be altered in at least two orientations. In certain embodiments, the reversible system additionally includes a photovoltaic module for powering the battery-operated device.

9 Claims, 31 Drawing Sheets

(56) References Cited

U.S. PATENT DOCUMENTS

| | | | |
|---|---|---|---|
| 8,295,043 B2* | 10/2012 | Tai | H04B 1/3888 |
| | | | 361/679.56 |
| 8,565,843 B1* | 10/2013 | Lugo | 455/575.4 |
| 8,716,591 B2 | 5/2014 | Misra et al. | |
| 2003/0096642 A1 | 5/2003 | Bessa et al. | |
| 2006/0164031 A1 | 7/2006 | Leem | |
| 2007/0222410 A1 | 9/2007 | Lee | |
| 2008/0157712 A1 | 7/2008 | Garcia | |
| 2009/0015192 A1* | 1/2009 | Sheu | A45C 11/00 |
| | | | 320/103 |
| 2009/0111543 A1* | 4/2009 | Tai et al. | 455/575.8 |
| 2009/0160400 A1* | 6/2009 | Woud | 320/115 |
| 2011/0169445 A1 | 7/2011 | Shirai | |
| 2011/0193519 A1 | 8/2011 | Alderman | |
| 2011/0204843 A1 | 8/2011 | Foster | |
| 2011/0290686 A1 | 12/2011 | Huang | |
| 2012/0196658 A1 | 8/2012 | Sun | |
| 2013/0088815 A1* | 4/2013 | Hu | G06F 1/1628 |
| | | | 361/679.01 |
| 2013/0106353 A1* | 5/2013 | Foster | H02J 7/0044 |
| | | | 320/114 |

OTHER PUBLICATIONS

XTG Technology, "Premium Solar Charger—Ultra Thin Solar Powered Backup Battery and Charger for Cell Phones," accessed from Internet on Sep. 26, 2012, 1 page.

Third Rail Mobility, LLC, "The Third Rail System User Manual," accessed from Internet on Sep. 26, 2012, 11 pages.

International Search Report and Written Opinion issued in PCT/US2013/0348988 dated Sep. 2, 2013, 18 pages.

U.S. Appl. No. 13/802,719 Office Action dated May 6, 2015, 31 pages.

U.S. Appl. No. 13/802,719 Final Office Action dated Nov. 19, 2015, 13 pages.

Chinese Patent Application No. 2013900009791 Notification of Undergoing Registration Procedures and Notification of Granting Patent Right, with Concise Explanation, dated Aug. 6, 2015, 3 pages.

\* cited by examiner

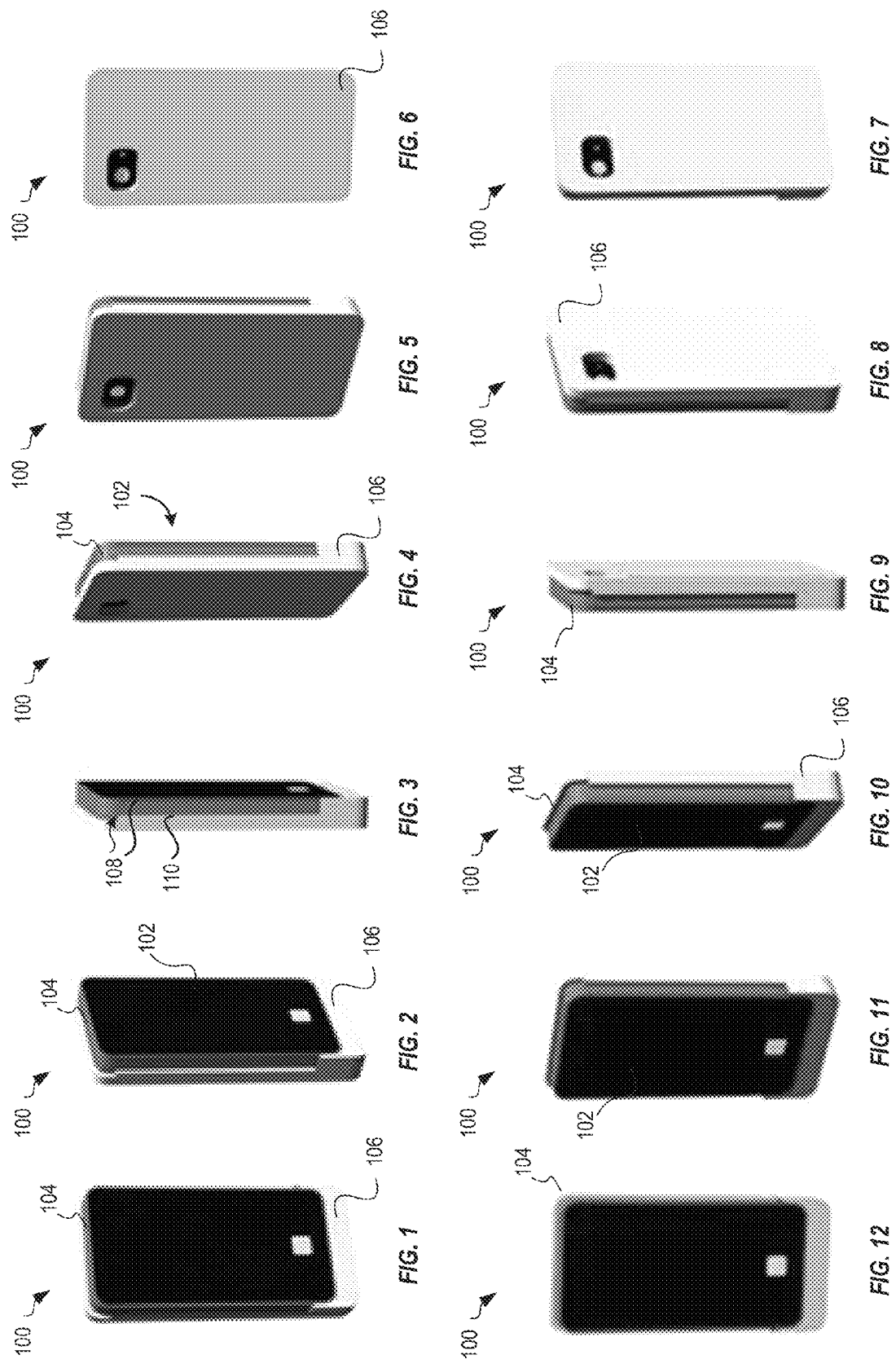

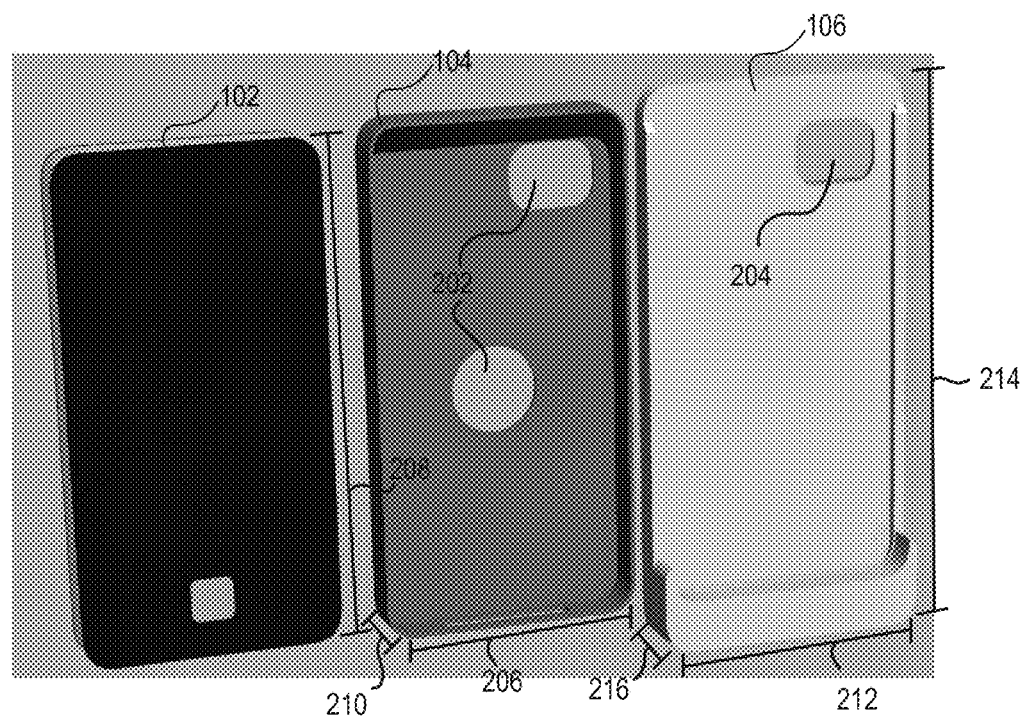
FIG. 13
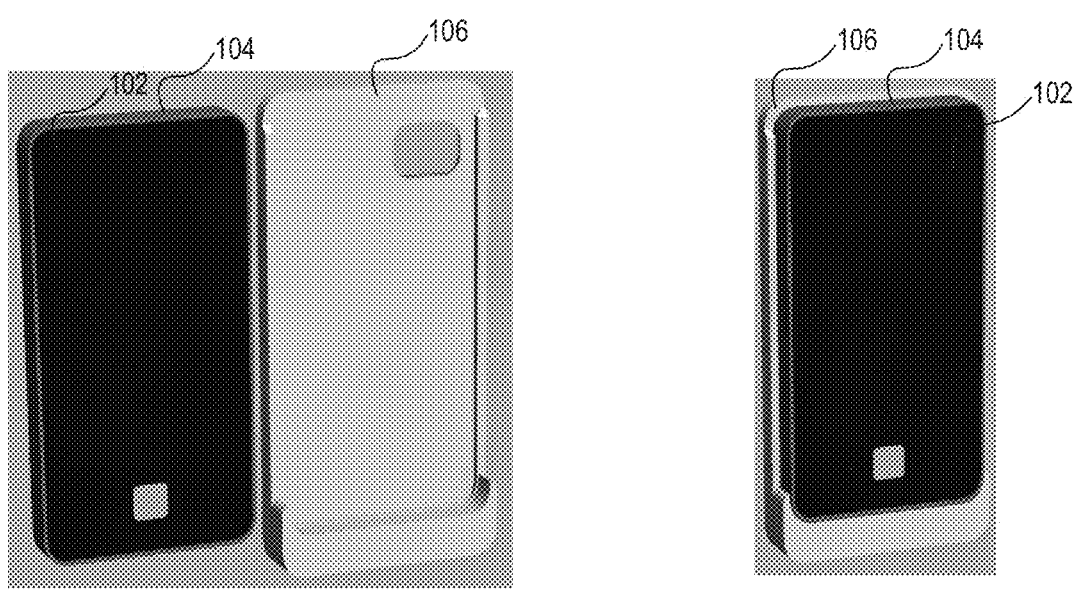
FIG. 14
FIG. 15

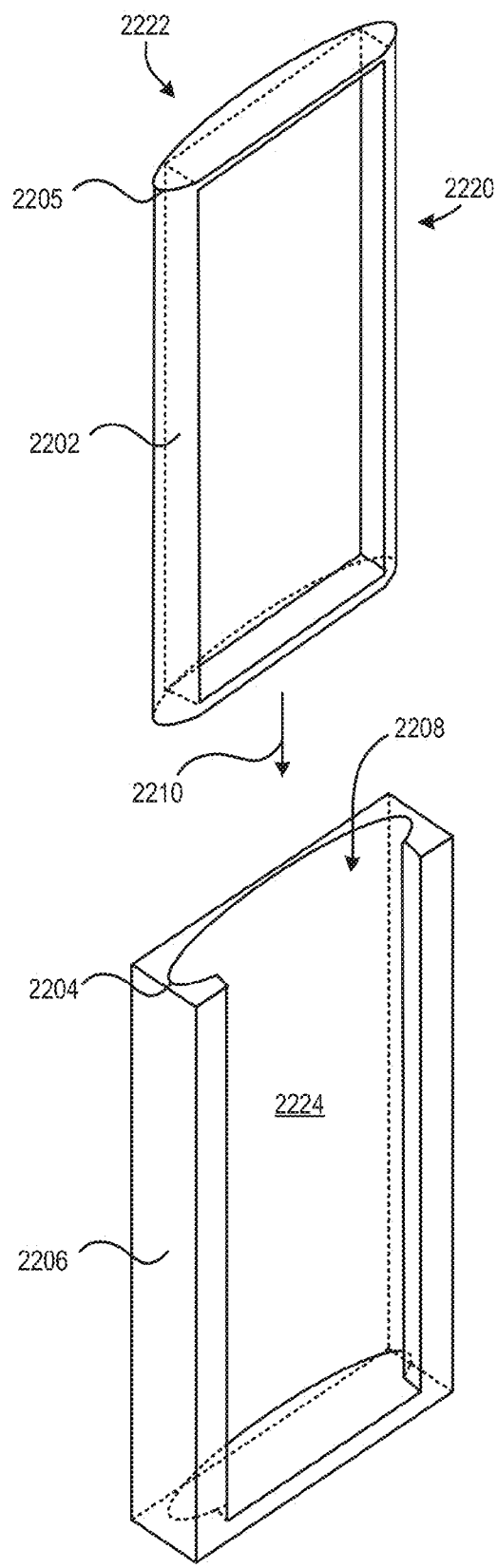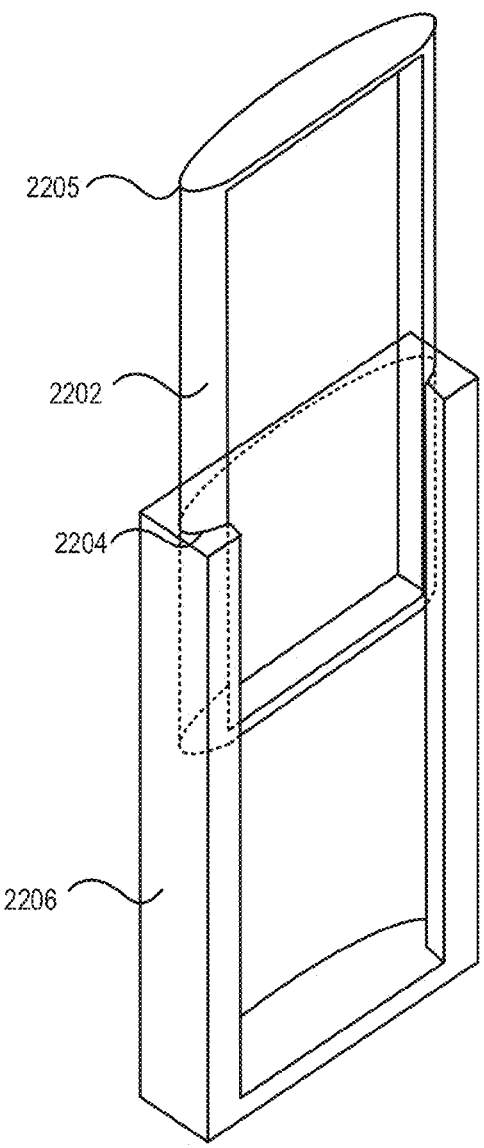
FIG. 21A
FIG. 21B

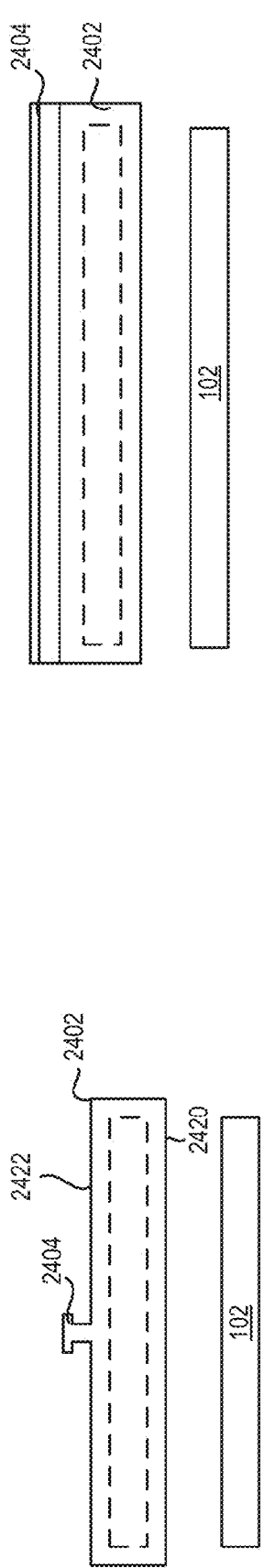
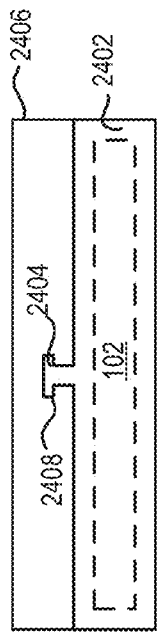
FIG. 25
FIG. 26
FIG. 24

SYSTEM FOR HOUSING AND POWERING A BATTERY-OPERATED DEVICE AND ASSOCIATED METHODS

RELATED APPLICATIONS

This application claims benefit of priority to U.S. Provisional Patent Application No. 61/737,656 filed Dec. 14, 2012, which is incorporated herein by reference.

BACKGROUND

Battery-operated electronic devices, such as mobile telephones, tablet computers, and laptop computers, etc., have become very popular. Cases for these electronic devices typically surround the back of the device, and incorporate a clear plastic sheet that sticks to the screen of the electronic device to protect from scratching. However, these sheets often become dirty and/or scratched, delaminate from the screen, and have bubbles that impede viewing of the content on the screen. Further, the battery-operated device typically must be inserted within the case in a specific orientation. For example, a conventional mobile phone case surrounds the back of the phone and provides little to no protection of the phone's screen.

Almost all of these devices rely on rechargeable batteries, such as lithium ion or lithium polymer batteries, for electric power. Due to the desire to minimize battery-operated device size, weight, and cost, as well as limitations of conventional battery technology, device batteries typically have a small capacity and therefore must be frequently recharged. For example, batteries of some mobile telephones, such as mobile telephones with advanced processors designed to run a wide variety of applications, may need to be recharged more than once per day during periods of extensive device use. Recharging a battery typically requires that the battery be electrically coupled to a fixed electrical power source, such as a building's electrical outlet, via a power converter commonly referred to as a "charger" or an "adaptor," thereby impairing the device's mobility. Accordingly, it is desirable to minimize battery-operated device battery charging from a fixed power source.

One possible way of reducing the need to charge a battery-operated device's battery from a fixed power source is to couple an external power source to the electronic device. In certain instances, the external power source contains an additional battery, a photovoltaic assembly, or both. The photovoltaic assembly generates an electric current in response to incident light, and the electric current charges the additional battery, and/or directly provides power to the device. Accordingly, coupling a photovoltaic assembly to an electronic mobile device may reduce, or even eliminate, the need to recharge the battery from a fixed power source.

Protective cases including photovoltaic assemblies have been proposed, for example, for use with mobile telephones and tablet computers. However, conventional photovoltaic assemblies are typically large and inflexible. Thus, cases incorporating these photovoltaic assemblies are typically bulky, thereby impairing the mobility, industrial design, and/or aesthetic properties of the mobile device that they are coupled to. For instance, one conventional mobile telephone case including a photovoltaic assembly is almost as thick as the mobile telephone itself, thereby significantly increasing the effective size and drastically changing industrial design of the telephone coupled to it.

Existing protective cases including a photovoltaic assembly are typically charged using either a USB cable or the onboard photovoltaic assembly. Charging via a USB cable requires that the mobile device be tethered by the cable, thereby restricting mobility, unless the device is removed from the protective case. Charging via the integrated photovoltaic assembly, on the other hand, typically requires removal of the mobile device from the case, before placing the case in sunlight for charging. If the battery-operated device is not removed from the case prior to photovoltaic charging, excessive temperature from sunlight exposure may cause the battery-operated device to shutdown, to prevent device damage.

SUMMARY

In an embodiment, a reversible system for housing a battery-operated device includes first and second case members. The first case member is for housing the battery-operated device and includes at least one first alignment member. The second case member includes at least one second alignment member. The at least one first alignment member and the at least one second alignment member are adapted to releasably secure the first case member to the second case member. The at least one first alignment member and the at least one second alignment member complement each other when the first case member is releasably secured to the second case member.

BRIEF DESCRIPTION OF THE FIGURES

FIGS. 1-12 depict various perspective views of a reversible system for housing and powering a battery-operated device, in one embodiment.

FIGS. 13-15 depict components of the reversible system of FIGS. 1-12 in various stages of assembly.

FIGS. 20-21B depict an exemplary concave/convex alignment member configuration, in one embodiment.

FIGS. 24-26B depict an exemplary protrusion/intrusion alignment member configuration, in one embodiment.

DETAILED DESCRIPTION OF THE EMBODIMENTS

Applicant has developed systems and methods for housing and powering a battery-operated device, which potentially achieve or more advantages over conventional cases for battery-operated device. For example, in certain embodiments, a case includes a first case member housing a battery-operated device and a second case member that receives or "cradles" the first case member. The second case member is structurally capable of receiving the first case member in at least two different orientations of the first case member. Accordingly, the battery-operated device may be disposed in at least two different orientations with respect to the second case member. The second case member optionally includes a photovoltaic assembly for powering the case.

As another example, certain embodiments include an integral case and a photovoltaic assembly. The integral case is adapted to house a battery-operated device, and the photovoltaic assembly is adapted to releasably attach to the integral case. Accordingly, the battery-operated device may be separated from the photovoltaic assembly, such as to prevent thermal shutdown and/or damage to the battery-operated device during photovoltaic assembly charging.

Possible applications of the systems and methods disclosed herein include, but are not limited to, mobile telephones, tablet computers, and/or laptop computer applications.

Figure 16:
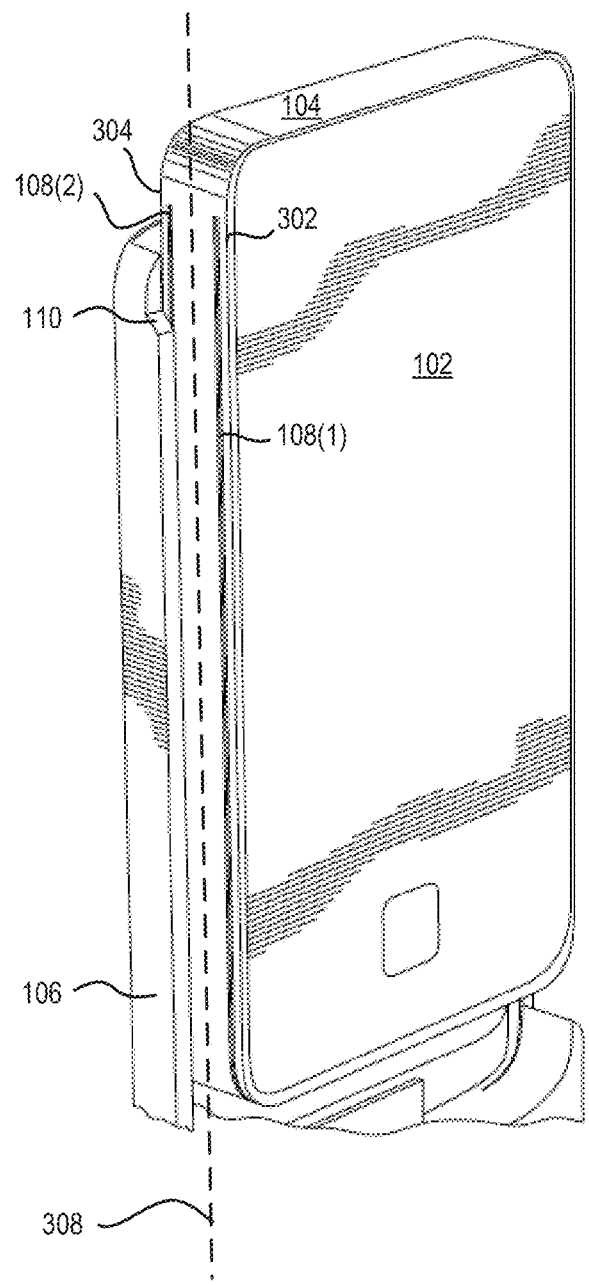
FIG. 16 depicts a zoomed out view of the alignment members of FIGS. 1-15.
Figure 18:
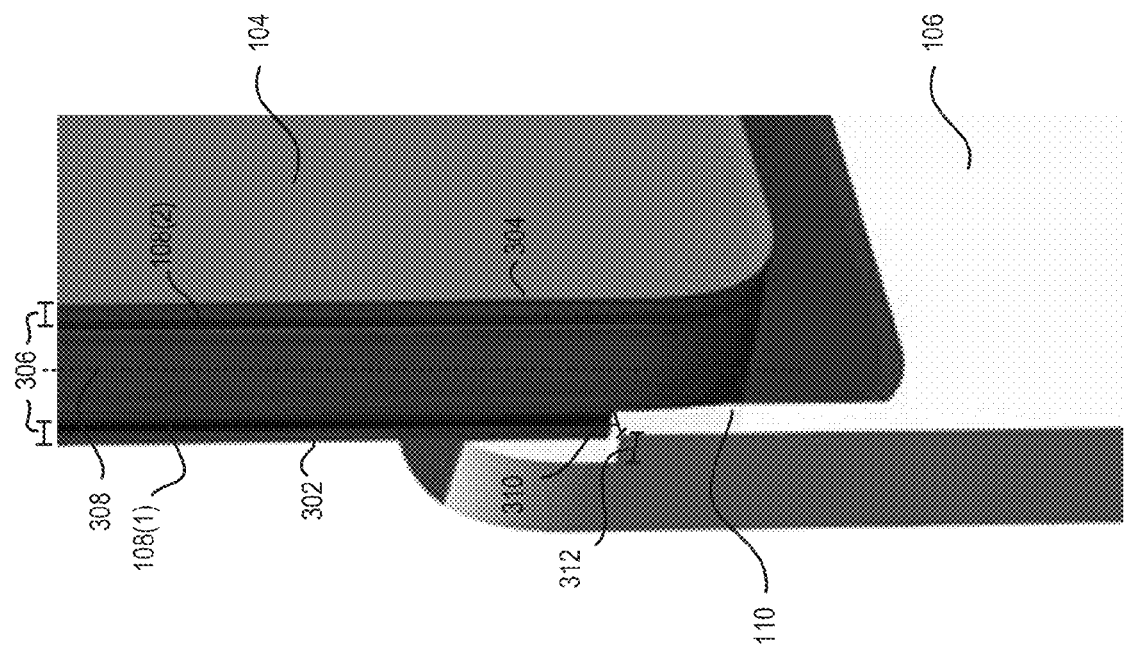
FIG. 18 depicts a zoomed in view of the alignment members FIGS. 1-15 where the battery-operated device is oriented at one-hundred eighty degrees with respect to second case member.
Figure 17:
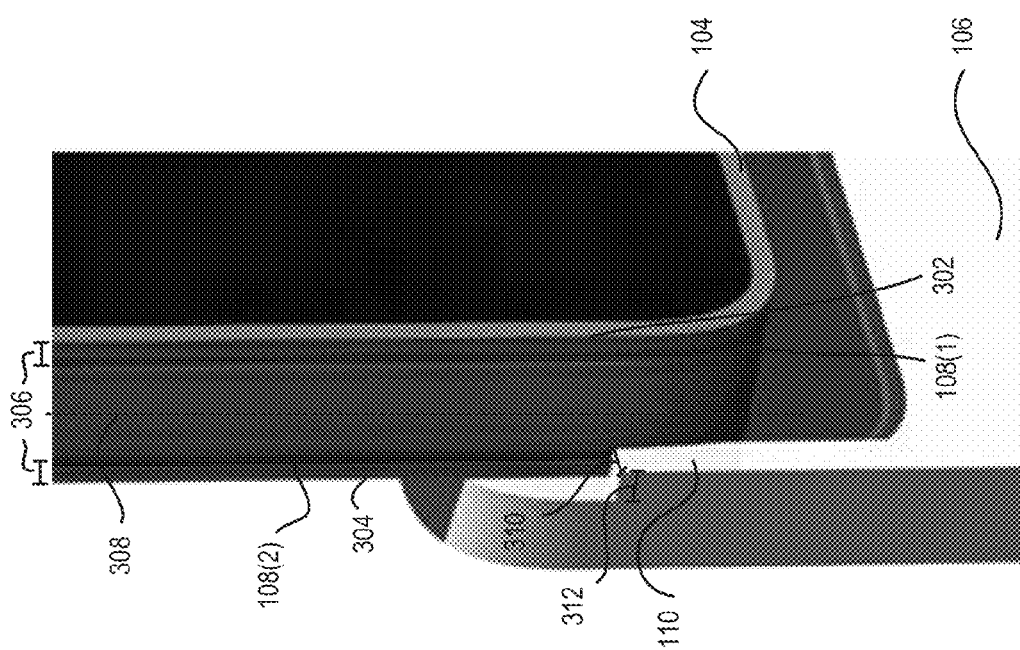
FIG. 17 depicts a zoomed in view of the alignment members FIGS. 1-15 where the battery-operated device is oriented at zero degrees with respect to second case member.
Figure 19:
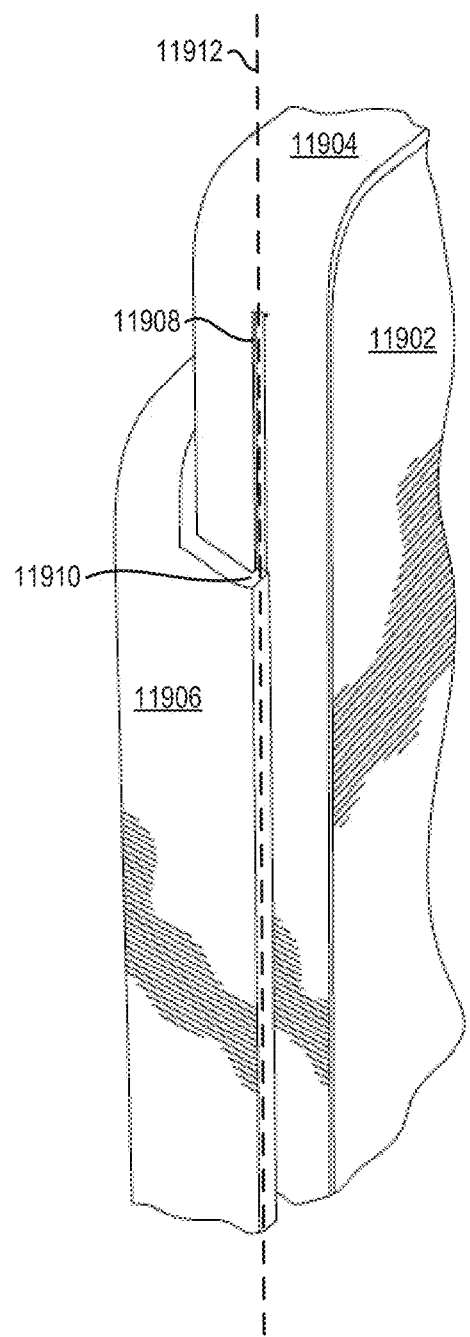
FIG. 19 depicts an exemplary reversible system for housing a battery-operated device having a single groove alignment member configuration, in one embodiment.
Figure 20:
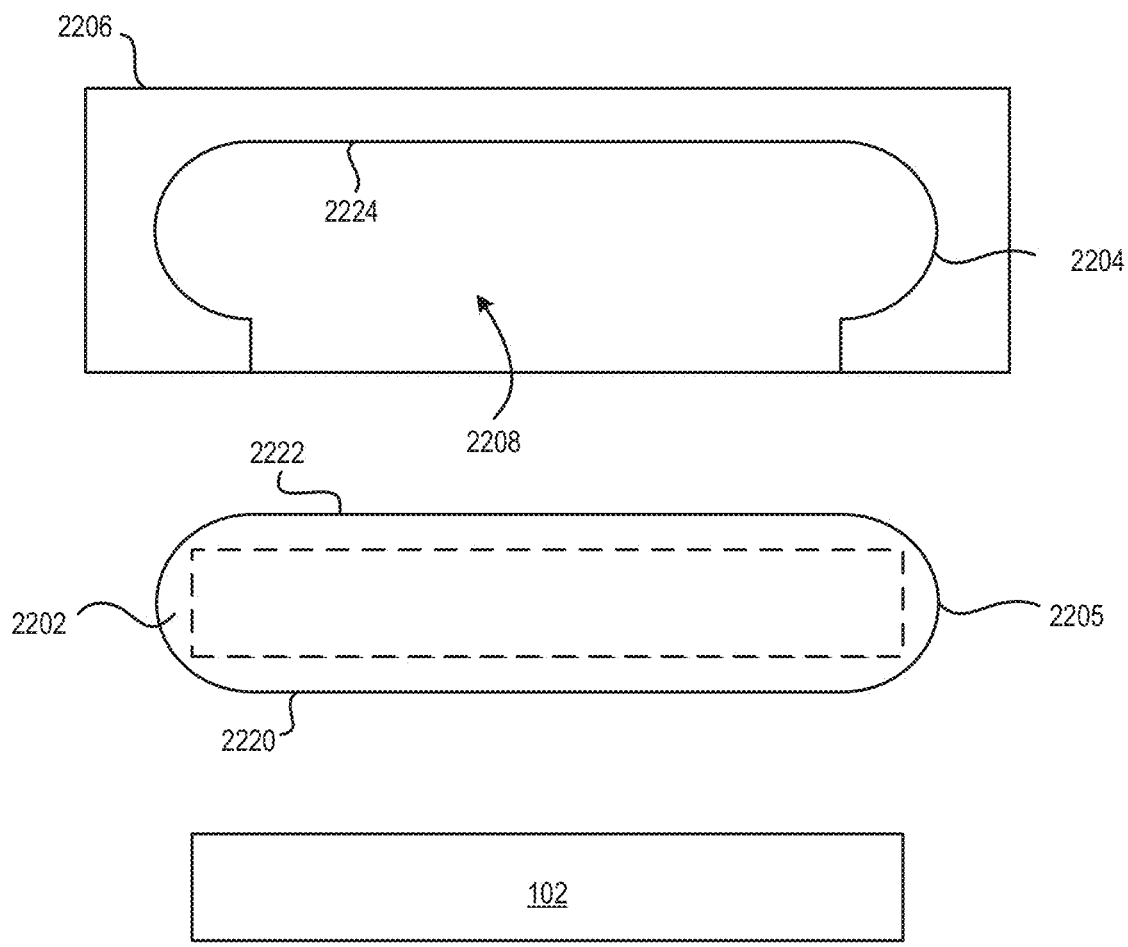
Figure 21:
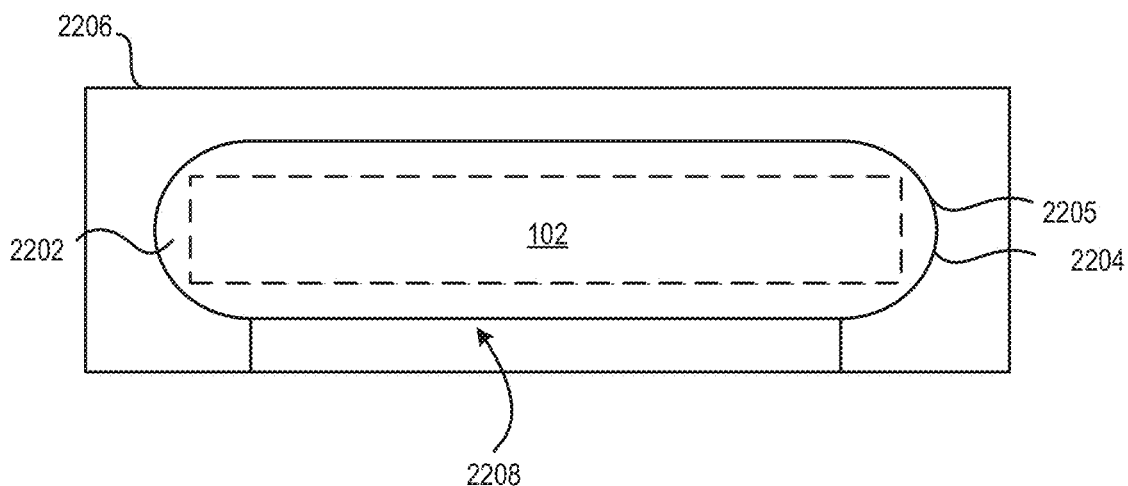
Figure 22:
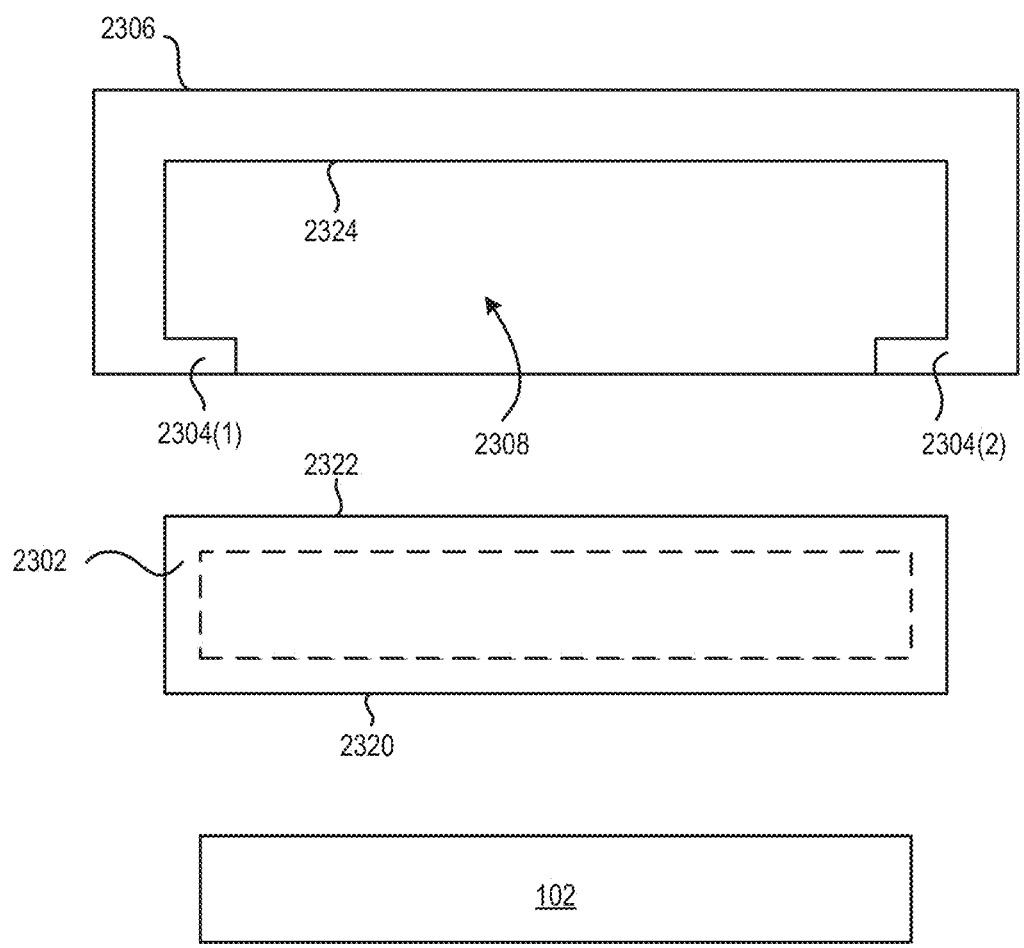
FIGS. 22-23B depict an exemplary slot alignment member configuration.
Figure 23:
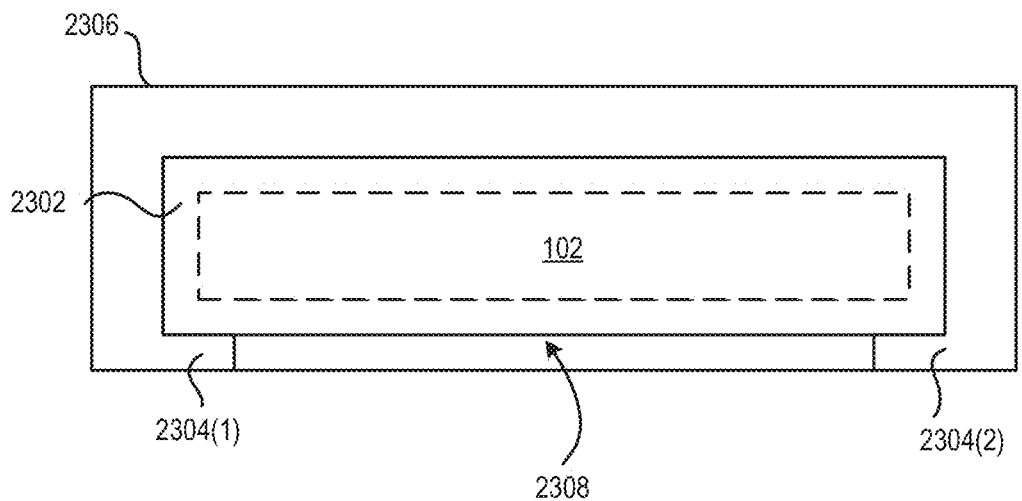

Reversible System for Housing Battery-operated Device:

FIGS. 1-12 depict various perspective views of a reversible system 100 for housing and powering a battery-operated device 102, in one embodiment. Battery-operated device 102 is, for example, a mobile telephone, as shown. For clarity of illustration, certain components are not labeled in every figure. FIGS. 13-15 depict components of reversible system 100 in various stages of assembly. FIG. 16 depicts a zoomed out view of alignment members 108, 110 of FIGS. 1-15. FIG. 17 depicts a zoomed in view of the alignment members 108, 110 of FIGS. 1-15 where the battery-operated device 102 is oriented at zero degrees with respect to second case member 106, such that a screen of device 102 faces outward. FIG. 18 depicts a zoomed in view of the alignment members 108, 110 of FIGS. 1-15 where the battery-operated device 102 is oriented at one-hundred eighty degrees with respect to second case member 106, such that the screen faces inward. FIG. 19 depicts an exemplary reversible system for housing a battery-operated device having a single groove alignment member configuration, in one embodiment. FIGS. 20-21 depict an exemplary concave/convex alignment member configuration, in one embodiment. FIGS. 22-23 depict an exemplary slot alignment member configuration. FIGS. 24-26 depict an exemplary protrusion/intrusion alignment member configuration, in one embodiment. FIG. 27 depicts a series of possible positions of the reversible system 100, of FIGS. 1-18, showing the first case member 104 housing the battery-operated device 102 at different orientations. FIGS. 1-27 are best viewed together with the below description.

Reversible system 100 includes a first case member 104 and a second case member 106. First case member 104 has a length 208, a width 206 perpendicular to length 208 and sides having a depth 210 (depth 210 is orthogonal to width 206 and length 208). Second case member 106 has a width 212, a length 214, and a bottom portion having depth 216 (depth 216 is orthogonal to width 212 and length 214). As illustrated by FIGS. 13-15, first case member 104 houses a battery-operated device 102, and second case member 106 is adapted to "cradle" first case member 104. First case member 104 is, for example, a thin case member made of plastic, rubber, silicon, metal or any other material that provides protection to battery-operated device 102.

As used herein, the term "cradle" includes receiving, in such a manner that the first case member is removeably attachable to the second case member. Further, when the first case member is "cradled" into the second case member, the first case member is releaseably secured in its location with respect to the second case member. In this approach, "cradle" does not refer to a specific orientation of the first case member relative to the second case member, as the first case member can be "cradled" by the second in at least two orientations. However, the second case member does not "cradle" the first case member if the orientation of one to the other is not permitted mechanically or electrically.

Alignment Members:

First case member 104 includes at least one first alignment member 108. Second case member 106 includes at least one second alignment member 110 that complements first alignment member 108 when the first case member is joined to the second case member. As illustrated in FIGS. 16-18, first alignment member 108 may be at least one groove on first case member 104. Second alignment member 110 may be a tab, or a plurality of tabs, that are adapted to dispose in respective grooves of first case member 104, when second case member 106 is joined to first case member 104 (i.e., when second case member 106 cradles first case member 104). First and second alignment members 108, 110 are adapted to releasably secure first case member 104 to second member 106, such that second case member 106 cradles first case member 104. Thus, a user can slide first case member 104 into second case member 106 by aligning first and second alignment members 108, 110, such as shown in FIG. 27, so that second case member 106 cradles first case member 104. The user can subsequently slide first case member 104 out of second case member 106, such as illustrated in FIG. 27. In the embodiment illustrated in FIGS. 1-18, the at least one first and second alignment members 108, 110 are adapted such that the orientation of the case member 104 (housing the battery-operated device 102) relative to second case member 106 may be altered in at least two orientations. For example, the orientation may be altered, as illustrated in FIG. 27, by one-hundred eighty degrees such that the screen of the battery-operated device 102 may be facing either inward or outward from the second case member 106. Alignment members 108, 110 may prevent other orientations that can prove harmful to the mechanical and/or electrical integrity of the device. For example, the alignment member 108 may prevent the first case member 104 (housing battery-operated device 102) from being oriented within the second case member 106 such that the battery-operated device 102 is upside down.

The ability to alter the orientation of the battery-operated device in system 100 provides protection to battery-operated devices that have a screen on one side. For example, where the battery-operated device is not going to be immediately used, the device may be cradled into the second case member at an orientation such that the screen is facing inward. Therefore, the screen is protected from getting scratched (e.g. when in a pocket, purse, or other area for storage). On the other hand, where the battery-operated device is in use, the device can be oriented such that the screen is facing outward while still being cradled by the second case member. Even further, if a user does not wish to use the second case member (e.g. to reduce the bulkiness of the reversible system 100), the user may uncradle (e.g. detach, release, etc.) first case member 104 from second case member 106, such that the battery-operated device is still protected by the first case member, because the battery-operated device may remain housed in the first case member when the first case member is not cradled in the second case member.

The first alignment members 108 are illustrated as two grooves 108(1), 108(2) toward each outer edge of the side of first case member 104. In this document, specific instances of an item may be referred to by use of a numeral in parentheses (e.g., groove 108(1)) while numerals without parentheses refer to any such item (e.g., grooves 108). Each groove is of equivalent distance 306 from front edge 302 and rear edge 304 of first case member 104. Although each groove is illustrated as being an equivalent distance 306, the distances 306 are not limited in scope. For example, groove 108(1), i.e. the groove toward the screen of the battery-operated device, may be of an appropriate distance to allow space between the second case member and the screen of the battery operated device.

The depth 310 and height 312 of tabs 110 are then adapted according to distance 306 such that first case member 104 may slide onto second case member 106 irrespective of whether first case member 104 is oriented at zero or one-hundred eighty degrees relative to second case member 106. For example, as illustrated in FIGS. 17-18, height 312 is equivalent to distance 306. Accordingly, the first alignment members 108 may be symmetrically placed along an elongated axis 308 of the sides of first case member 104. However, system 100 is not limited to such configuration. For example, there may be a first alignment member symmetrically placed along an elongated axis of the bottom of the first case member.

As illustrated in FIG. 19, in an alternate embodiment, there may be a single alignment member 11908 in the form of a groove. The single groove may be along elongated axis 11912 of first case member 11904. Accordingly, second alignment member 11910 may be formed by a tab that is sized and shaped such that the first case member 11904 may be cradled by second case member 11906 when the tab is disposed in the single groove irrespective of whether first case member 11904 is oriented at zero or one-hundred eighty degrees relative to second case member 11906.

In yet another embodiment, the alignment member and/or tab may include adjoining concave/convex curvature of the case along the elongated axis of the first and second case members, respectively. FIG. 20 illustrates a top uncradled view of first case member 2202, battery-operated device 102, and second case member 2206. Second case member 2206 includes concave curvature 2204. First case member 2202 is sized and shaped to have convex curvature 2205 along the elongated axis that complements concave curvature 2204. FIG. 21 illustrates cradled top view of first case member 2202 housing battery-operated device 102, and cradled into area 2208 defined by the concave curvature 2204 of second case member 2206. FIG. 21A depicts a perspective view of the first and second case members of FIGS. 20-21. FIG. 21A is illustrated without a battery-operated device for clarity of illustration. First case member 2202 cradles into second case member 2206 by being inserted into area 2208 as illustrated by arrow 2210. The convex curvature 2205 of first case member 2202 compliments the concave curvature 2204 of second case member 2205, as illustrated in FIG. 21B.

The orientation of first case member 2202 to second case member 2206 may be altered in at least two orientations. For example, first case member 2202 may be cradled into second case member 2206 such that either one of front face 2220 or back face 2222 faces outward (i.e. away from face 2224 of second case member 2206).

Figures 23A, 23B:
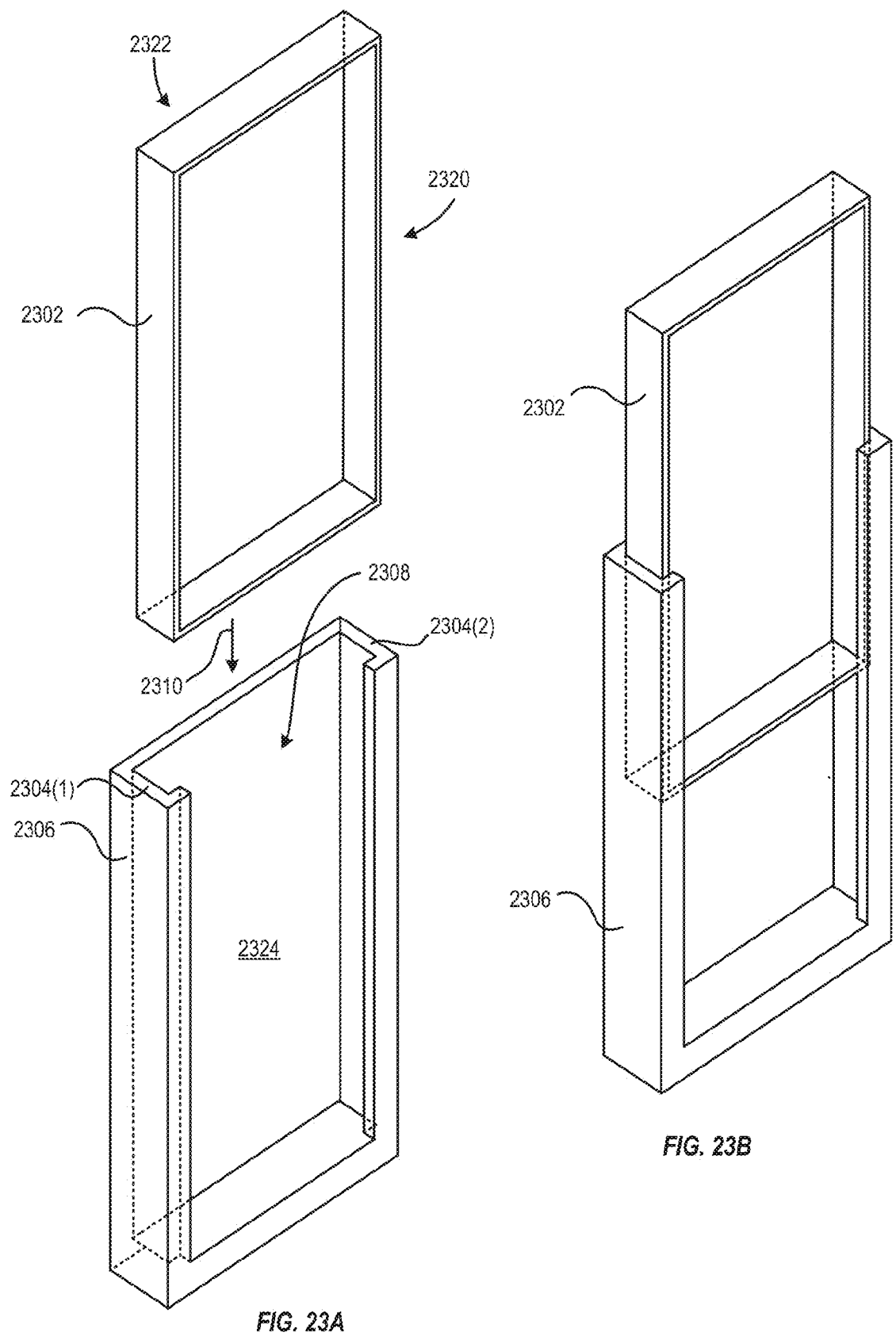

In yet another embodiment, first case member may be cradled into second case member using a means of capturing the first case member with the second from the outside of the inner case member, thus providing a channel for the entire first case member. FIG. 22 illustrates a top uncradled view of first case member 2302, second case member 2306, having alignment members 2304(1) and 2304(2) that form channel 2308. FIG. 23 illustrates a top cradled view of first case member 2302, second case member 2306. First case member 2302 is housing battery-operated device 102 and is cradled in second case member 2306 within channel 2308. FIG. 23A depicts a perspective view of the first and second case members of FIGS. 22-23. FIG. 23A is illustrated without a battery-operated device for clarity of illustration. First case member 2302 cradles into second case member 2306 by being inserted into channel 2308 in direction 2310. Channel 2308 is sized and shaped to compliment the dimensions of the outer surface of first case member 2302 as illustrated in FIG. 23B.

The orientation of first case member 2302 to second case member 2306 may be altered in at least two orientations. For example, first case member 2302 may be cradled into second case member 2306 such that either one of front face 2320 or back face 2322 faces outward (i.e. away from face 2324 of second case member 2306).

In another embodiment, the first alignment members comprise protrusions from the back of the first case member and the second alignment members comprise intrusions on the face of the second case member adapted to compliment the protrusions. FIG. 24 shows a top uncradled view of a first case member including a protrusion and a second case member including an intrusion, in one embodiment. FIG. 25 illustrates a side uncradled view of the first case member and second case member of FIG. 24. FIG. 26 depicts a top cradled view of the first and second case members of FIGS. 24-26. First case member 2402 is illustrated having a single protrusion 2404. Second case member 2406 is illustrated having a single complementing intrusion 2408. The embodiments are illustrating having a single protrusion 2404 and intrusion 2408, however they are not limited in scope. For example, there may be a plurality of protrusions 2404 and complimenting intrusions 2408.

Figure 26A:
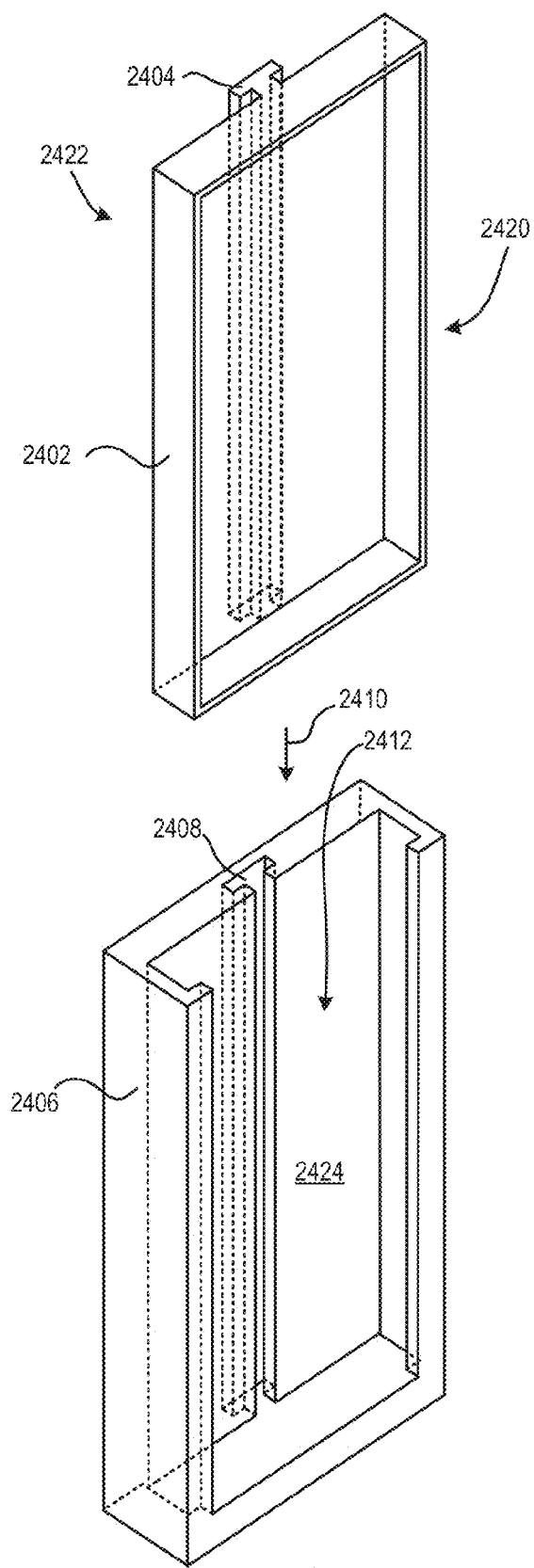
Figure 26B:
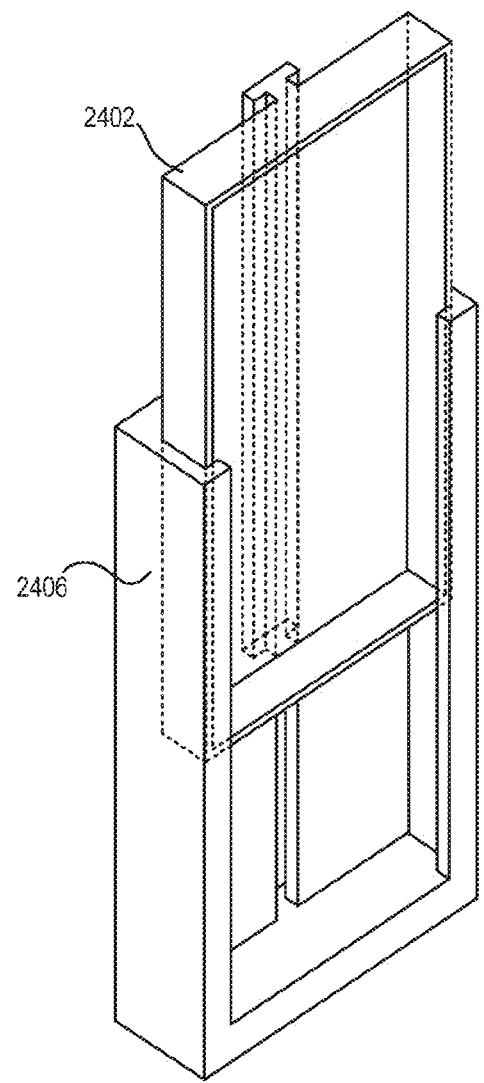
Figure 27:
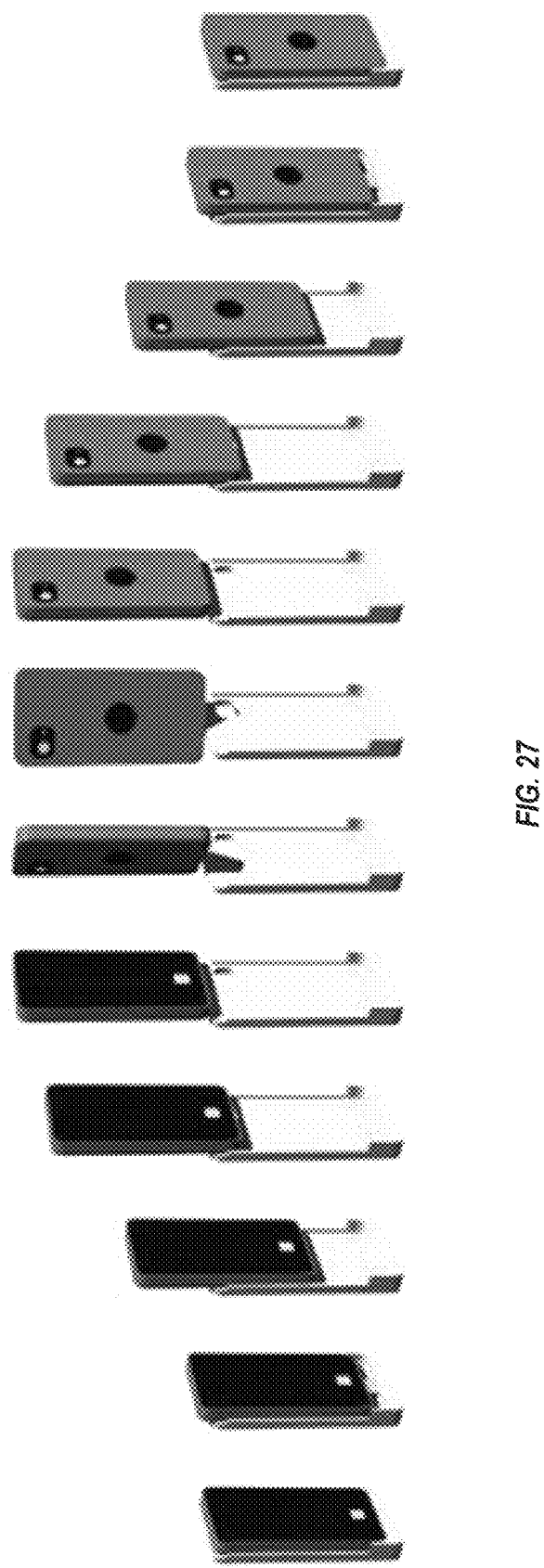
FIG. 27 depicts a series of possible positions of the reversible system, of FIGS. 1-18, showing the first case member housing the battery-operated device at different orientations.

FIG. 26A depicts a perspective view of the first and second case members of FIGS. 24-26. FIG. 26A is illustrated without a battery-operated device for clarity of illustration. First case member 2402 cradles into second case member 2406 by being inserted into area 2412 in direction 2410. Accordingly, protrusion 2404 on first case member 2402 mates with complimenting intrusion 2408 on second case member 2406. There may be more or fewer protrusions and intrusions without departing from the scope hereof. FIG. 26B illustrates a first case member 2402 being cradled by a second case member using a protrusion and intrusion alignment member.

The orientation of first case member 2402 to second case member 2406 may be altered in at least two orientations. For example, first case member 2402 may be cradled into second case member 2406 such that either one of front face 2420 or back face 2422 faces outward (i.e. away from face 2424 of second case member 2406).

In yet another embodiment, other means, such as magnetic attraction, may be used to cradle the first case member to the second case member in any of the allowed orientations.

Finally, the orientation of the first case member to the second case member may be detected by the second case member's electronics, and as such, the functionality of one or more of the battery-operated device and the second case member may be altered by this detection. For example, the second case member may include a detection circuit. Such functionality may be a current limit to the electronic device to prevent thermal overload that may be possible in one orientation versus another.

Additional Features:

The embodiments described above optionally include at least one aperture to provide access to buttons, switches, optical and audio interfaces, identifying information, or other features of the battery-operated device. For example, first case member 104 may include at least one first aperture 202. Second case member 106 may include at least one second aperture 204 that aligns with the at least one first aperture 202. As illustrated in FIGS. 1-27, the apertures 202 and 204 align to provide access to the optical camera of battery-operated device 102. Not all apertures are labeled in FIGS. 1-27 for clarity of illustration. Furthermore, the second case member 106 may not have apertures to align with the apertures of the first case member 104. For example, walls, alignment members, or other aspects of the second case member 106 may be omitted to provide access to the at least one first aperture 202 in the first case member. Additionally, apertures 202, 204 of first and second case members do not necessarily need to align when fitted in a non-operational orientation, such as when the face of the electronic device is facing the second case member.

In alternate embodiments, reversible system 100 may include additional features including, but not limited to, cosmetic augmentation, means for retaining business cards, charge cards, photos, and other items that fit within the form factor of the first and/or second case elements.

Figure 28:
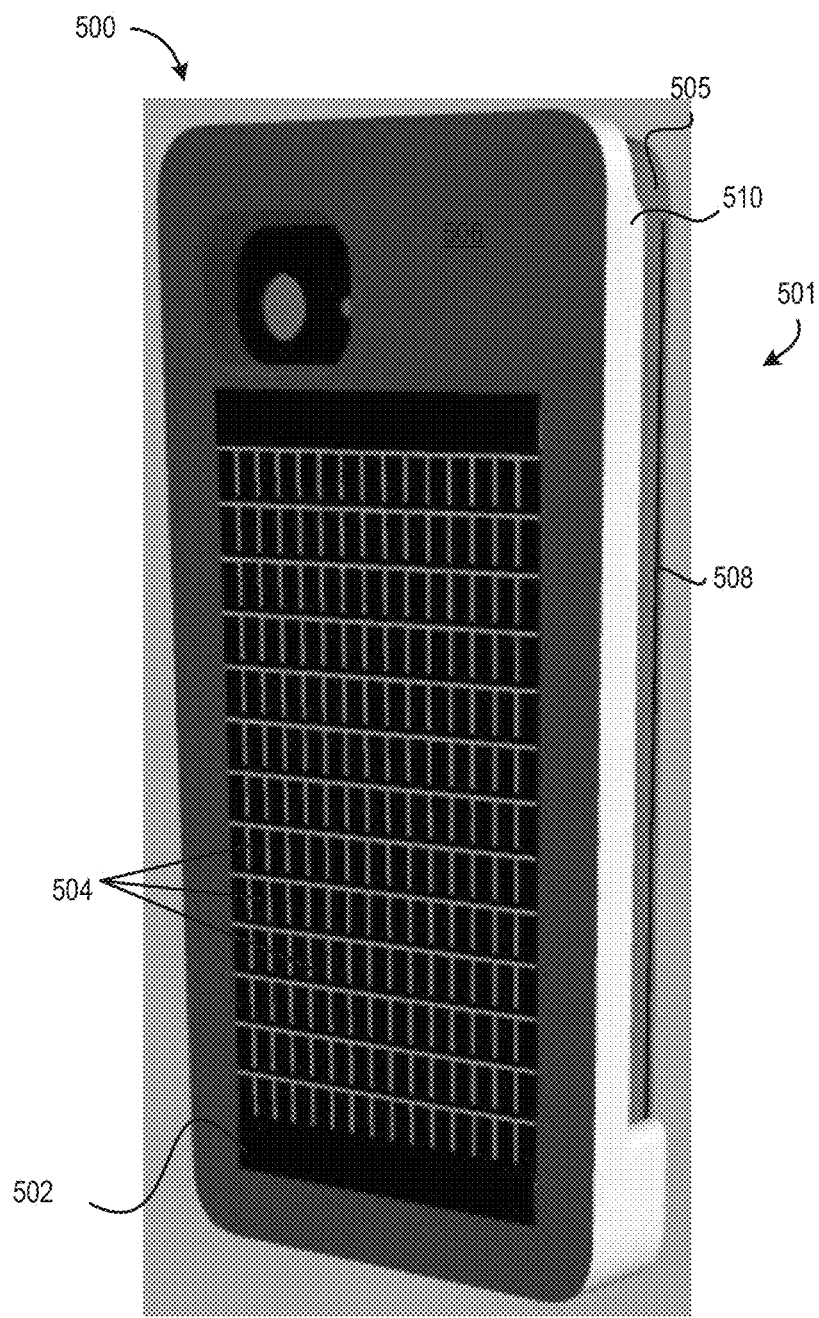
FIG. 28 depicts a reversible system for housing and powering a battery-operated device, in one embodiment.
Figure 29:
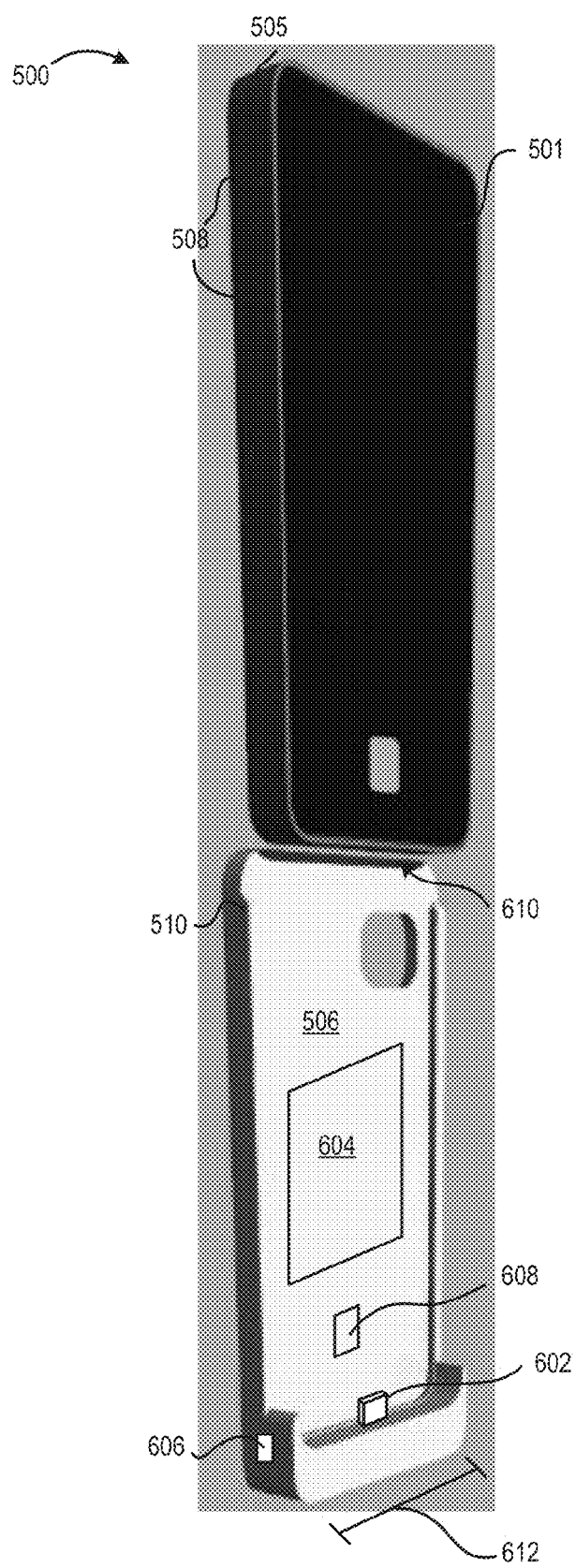
FIG. 29 depicts the reversible system of FIG. 28 from an alternate perspective.

Reversible System for Housing and Powering Battery-Operated Device:

As discussed above, certain embodiments include a photovoltaic module incorporated into the second case member. For example, FIG. 28 depicts a reversible system 500 for housing and powering a battery-operated device. System 500 is similar to system 100 of FIGS. 1-12, but system 500 further includes additional features, such as a photovoltaic module. FIG. 29 depicts the reversible system 500 from an alternate perspective.

As illustrated in FIGS. 28 and 29, system 500 includes first and second case members 505 and 506, respectively, that are similar to first and second case members 104, 106, respectively, of system 100. For example, first and second case members 505, 506 include alignment members 508, 510 similar to alignment members 108, 110 respectively of system 100, such that first case member 505 can be oriented in at least two distinct orientations (e.g. at either zero or one-hundred eighty degrees with respect to second case member 506). In one embodiment, alignment members 508, 510 operate to prevent first case member 505 from being oriented to second case member 506 in a way that a connector (described below) does not make contact with the top of the battery-operated device.

Battery:

Second case member 506 additionally includes at least one of a battery 604, a photovoltaic module 502, a connector 602, a wall port 606, and a processor 608. Battery 604 is for example a rechargeable battery that can be recharged either using a wall port 606 that couples the battery to a wall adapter (not shown) for charging off of the grid. Battery 604 typically includes one or more of a Lithium Polymer (Li-Poly), Lithium Ion (Li-Ion), Nickel Cadmium (NiCd), or Nickel Metal Hydride (NiMH) battery. Those skilled in the art will appreciate, though, that battery 604 can take a different form with departing from the scope hereof. In another example, battery 604 is a fuel cell.

Photovoltaic Module:

System 500 is configured such that photovoltaic module 502 may at least partially recharge battery 604. Photovoltaic module 502 includes one or more photovoltaic cells 504 electrically coupled to battery 604. In one embodiment, photovoltaic cells 504 are monolithically integrated thin film photovoltaic cells. Monolithic integration potentially enables customization of module output voltage and output current ratings during module design, thereby allowing system 500 to be tailored to its intended application. Additionally, monolithic integration promotes small module size and pleasing aesthetic properties by reducing pitch between adjacent photovoltaic cells, as well by reducing or eliminating use of discrete bus bars to connect adjacent cells, relative to non-monolithically integrated photovoltaic modules.

In the context of this document, monolithically integrated means that the plurality of photovoltaic cells are formed of a common stack of thin film layers disposed on the substrate, where the stack includes (1) insulating scribes to separate adjacent photovoltaic cells or portions of photovoltaic cells, and (2) conductive vias to electrically couple layers of the stack. Thus, the stack of thin film layers is "patterned" with insulating scribes and "connected" with conductive vias to form a plurality of electrically interconnected photovoltaic cells. The photovoltaic cells are electrically coupled in series, in parallel, or in series-parallel. One example of monolithic integration techniques that may be used to form photovoltaic module 502 is disclosed in U.S. Patent Application Publication Number 2008/0314439 to Misra (Misra Publication), which is incorporated herein by reference. It should be understood, though, that photovoltaic module 502 may be formed using techniques other than, or in addition to, those taught in the Misra Publication.

The stack of thin film layers includes, for example, an electrically conductive back electrical contact layer disposed on the common substrate, a photovoltaic stack formed on the back electrical contact layer, and an electrically conductive front electrical contact layer disposed on the photovoltaic stack. The photovoltaic stack includes, for example, a solar absorber layer which generates electron-hole pairs in response to light incident thereon, and a heterojunction partner layer, such that the solar absorber layer and the heterojunction partner layer collectively form a p-n junction. Some examples of possible solar absorber layer materials include Copper-Indium-DiSelenide (CIS), or an alloy thereof, such as Copper-Indium-Gallium-DiSelenide (CIGS). Some examples of possible heterojunction partner layer materials include Cadmium Sulfide or an alloy thereof. Additional layers, such as buffer layers and/or stress relief layers, may be added to the stack of thin film layers without departing from the scope hereof. A first bus bar is electrically coupled to the back electrical contact layer, and a second bus bar is electrically coupled to the front electrical contact layer, in certain monolithically integrated embodiments.

By placing photovoltaic module 502 on the second case member 506, the system allows battery 604 to be charged without subjecting battery-operated device 501 (battery-operated device 501 is similar to battery-operated device 102) to excessive thermal loads. For example, the second case member 506, incorporating a photovoltaic module 502, may be placed under sunlight while the battery-operated device 501 remains in the first case member 505. Therefore, the battery-operated device 501 remains protected by the first case member 505 and the second case member 506 can be charged using the photovoltaic module 502.

Photovoltaic module 502 optionally includes a transparent outer protection layer (not shown) covering photovoltaic cells 504, thereby protecting the photovoltaic cells from environmental elements, such as moisture, dirt, and mechanical force.

Processor 608 is electrically coupled to one or more of the photovoltaic module 502, the battery 604, the wall port 606, and the connector 602 to control operation of the reversible system 500. For example, processor 608 may control the charging of battery 604 using either the photovoltaic module 502 or wall port 606. Processor 608 may additionally control transfer of energy from battery 604 to battery-operated device 501 through connector 602. In some alternate embodiments, photovoltaic module 502 is omitted from second case member 506, and battery 604 is charged from wall port 606 or an alternative electric power source.

Connector:

Connector 602 is electrically coupled to battery 604 such that energy may be transferred from battery 604 to battery-operated device 501. In certain embodiments, connector 602 is a reversible connector and is centrally located along a width 612 of second case member 506. A reversible connector is a connector that connects to the battery-operated device with at least two different orientations of the connector with respect to the connector port of the battery-operated device. Examples of reversible connectors include, but are not limited to, the Apple® 'Lightning' Connector, coaxial connectors, multi-pin connectors with symmetry that enables rotation of the mating connector, etcetera. Examples of non-reversible connectors include, but are not limited to, the micro-USB, mini-USB, USB, Apple® 30-pin connector, multi-pin connectors with keyed cases, etc. Connector 602, as illustrated is centrally located on the bottom portion of second case member 506. The central location of connector 602 allows for the battery-operated device 501 to connect to connector 602 in at least two orientations (e.g. either zero or one-hundred eighty degrees orientation (e.g. screen facing toward the second case member or screen facing outward from the second case member). First case member 505 includes an aperture 610 such that connector 602 may connect to the connector port of the battery-operated device.

Some battery-operated devices incorporate a connector port that is not centrally located. For example, the device connector port may be offset to the left or right. In such instances, the battery-operated device orientation with respect to the second case member would not be able to be altered, because the connector would not properly align when the orientation is altered. Accordingly, in certain alternate embodiments, connector 602 is not centrally located along width 612.

Figure 30:
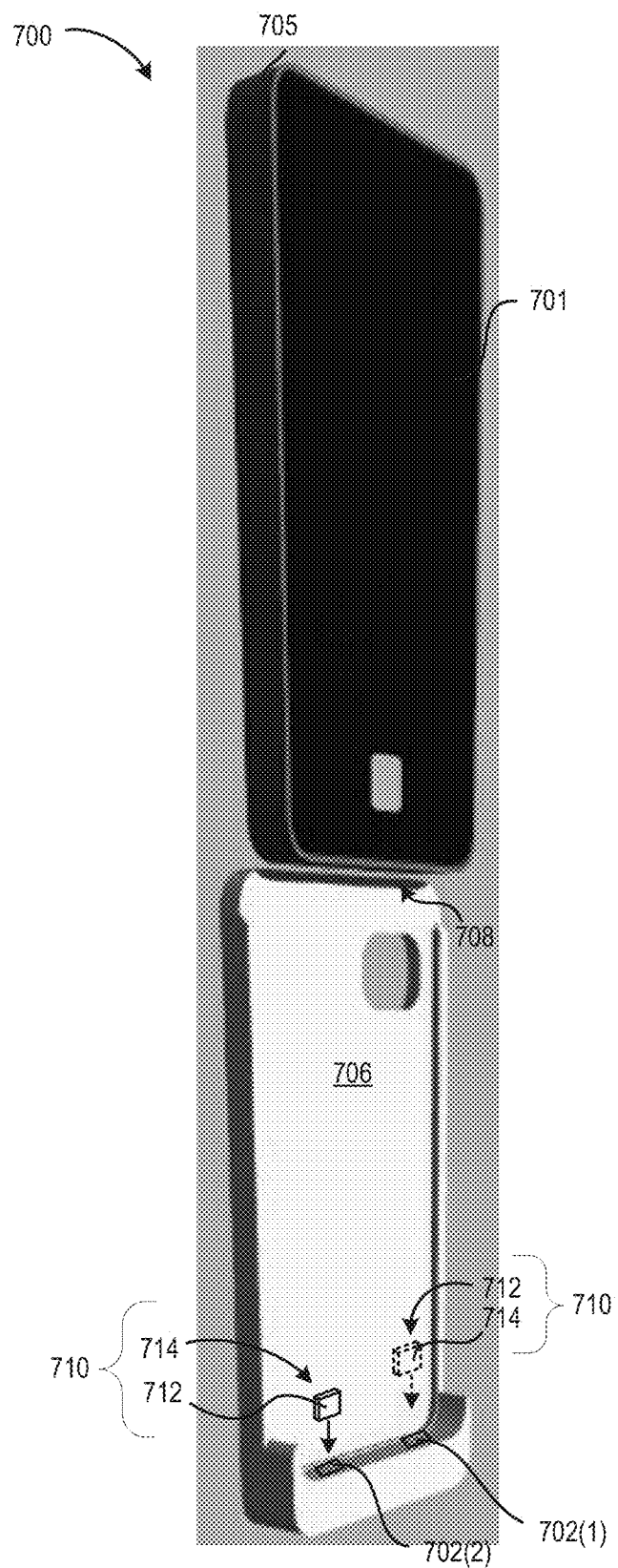
FIG. 30 depicts a reversible system for housing and powering a battery-operated device with at least one non-centrally located electronic device connector port, in one embodiment.

FIG. 30 depicts a reversible system 700 for housing and powering a battery-operated device 701 with at least one non-centrally located electronic device connector port 702. System 700 is similar to system 500 and includes the same components, except that first and second case members 505, 506 are replaced with first and second case members 705, 706, respectively. Second case member 706 is the same as second case member 506, except that second case member 706 includes a variably located connector subsystem in place of connector 602, as will be described below. For clarity of illustration, elements of the battery, connector port, and processor are not shown or labeled in FIG. 30.

System 700 includes, inter alia, a plurality of second case member connector ports 702, and a connector adapter 710 having a front side 712 and opposite back side 714. Connector adapter 710 is configured to be inserted in one of connector ports 702 and thereby electrically couple device connector port 708 to second case member 706. For example, if electronic device 701 is to be inserted into second case member 706 such that a screen of device 701 faces outward (away from member 706), connector adapter 710 is disposed in connector port 702(1). On the other hand, if electronic device 701 is to be inserted into second case member 706 such the screen of device 701 faces inward (towards member 706), connector adapter 710 is disposed in connector port 702(2). Thus, at least two orientations (e.g. either zero or one-hundred eighty degrees orientation) of first case member 705 with respect to second case member 706 may be achieved by disposing connector adapter 710 in the appropriate connector port 702.

In some embodiments, device connector port 708 is asymmetrical. In such embodiments, the orientation of connector adapter 710 will differ according to which port 702 the connector adapter 710 is disposed in. For example, in a particular embodiment, connector adapter 710 is disposed port 702(1) such that back side 714 faces outward, and connector adapter 710 is disposed in port 702(2) such that front side 712 faces outward.

In certain alternate embodiments, system 700 includes only one connector port 702, and the orientation of connector adapter 710 can be altered based on the orientation of first case member 705. These embodiments are used, for example, in applications where a device housed in first case member 705 includes a non-reversible device connector port in the center of the bottom of the device. In these embodiments, the orientation of connector adapter 710 can be altered in accordance with the requirements of the battery-operated device.

In yet additional battery-operated devices, the connector may connect along the top, side or back of the battery-operated device, instead of the bottom as previously described with regards to FIGS. 28-30. Accordingly, in certain alternate embodiments, the first case member incorporates an intermediary connector that provides the ability to alter the orientation of the first case member to the second case member while still coupling the battery to the battery-operated device.

Figure 31:
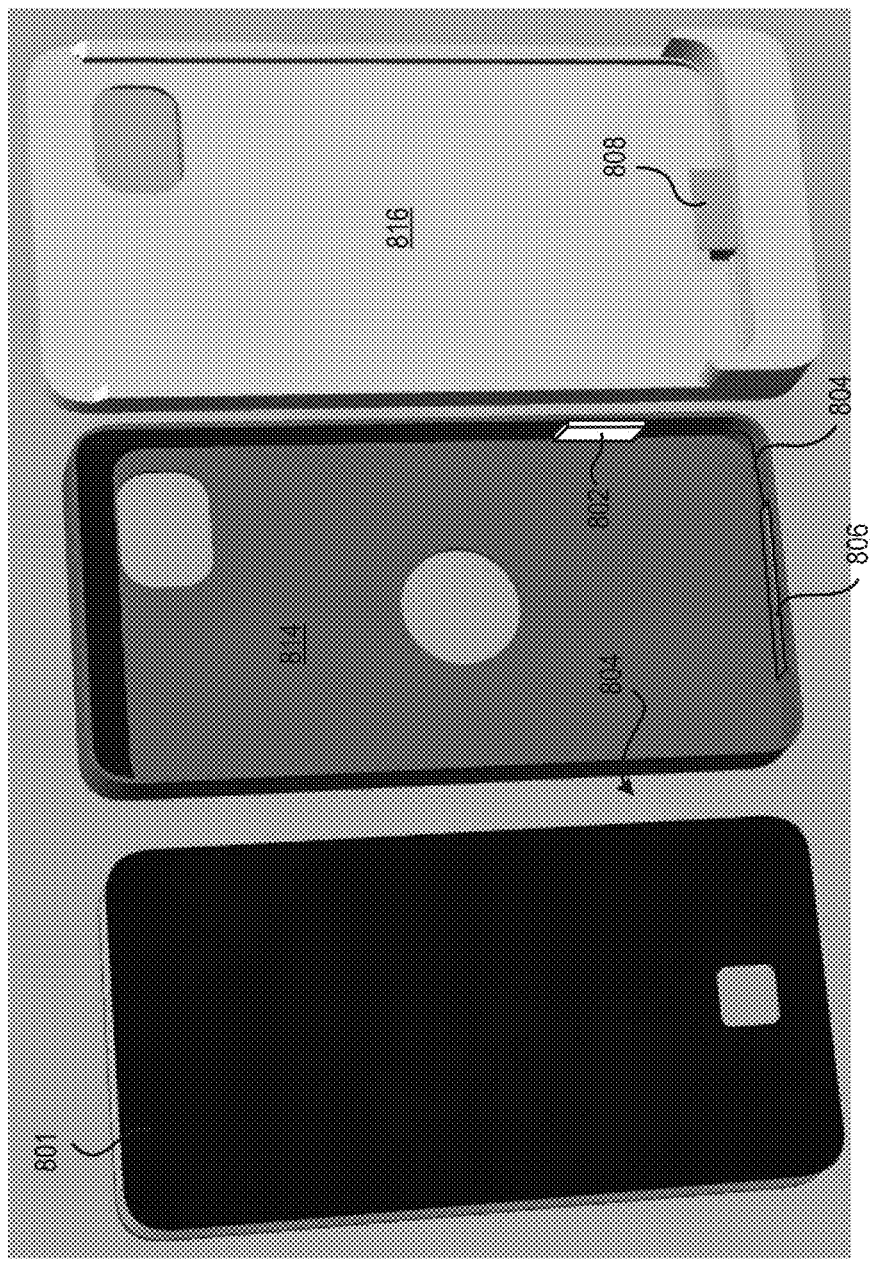
FIG. 31 depicts a reversible system for housing and powering a battery-operated device incorporating an intermediary connector, in one embodiment.

FIG. 31 depicts a reversible system 800 for housing and powering a battery-operated device incorporating an intermediary connector 802, in one embodiment. System 800 is similar to systems 500 and 700, except system 800 incorporates an intermediary connector 802, as will be described below. For clarity of illustration, elements of the battery, connector port, and processor are not shown or labeled in FIG. 30.

System 800 includes, inter alia, a first intermediary connector 802 located on a first case member 814 and adapted to connect to a device connector port 804 of a battery-operated device 801. It will be appreciated that first intermediary connector 802 is not limited in scope to the location shown, and may be adapted based upon the particular battery-operated device 801. First intermediary connector 802 is electrically coupled, via conductor 804 and intermediary connector adapter 806, to second intermediary connector 808 that is located on second case member 816. Intermediary connector adapter 806 and second intermediary connector 808 may be reversible. Accordingly, when battery-operated device 801 is inserted into first case member 814, the orientation first case member 814 can be altered while still coupling the battery of the second case member 816 to the battery-operated device 801.

Those skilled in the art will appreciate alternate forms of connectors are possible. For example, in certain alternate embodiments, the connectors described above (602, 710, 802) are partially or completely implemented using wireless power transfer techniques. For example, the second case member could include a power transmitter (e.g. a primary coil), and the first case member could include a power receiver (e.g. a secondary coil), such that power is wireless transferred from the second to first case members when the two case members come into proximity of one another.

Additional Features: Removable Battery

Figure 45:
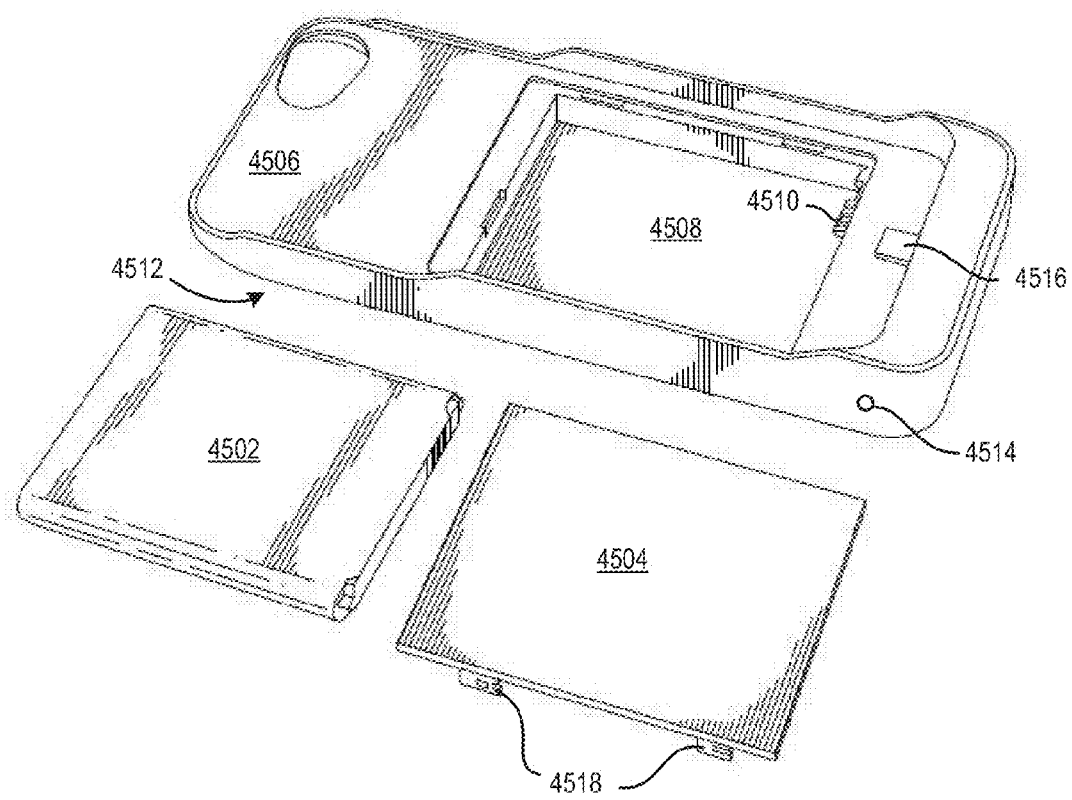
FIG. 45 depicts an exemplary unassembled view of an exemplary reversible system having a removable battery, in one embodiment.
Figure 46:
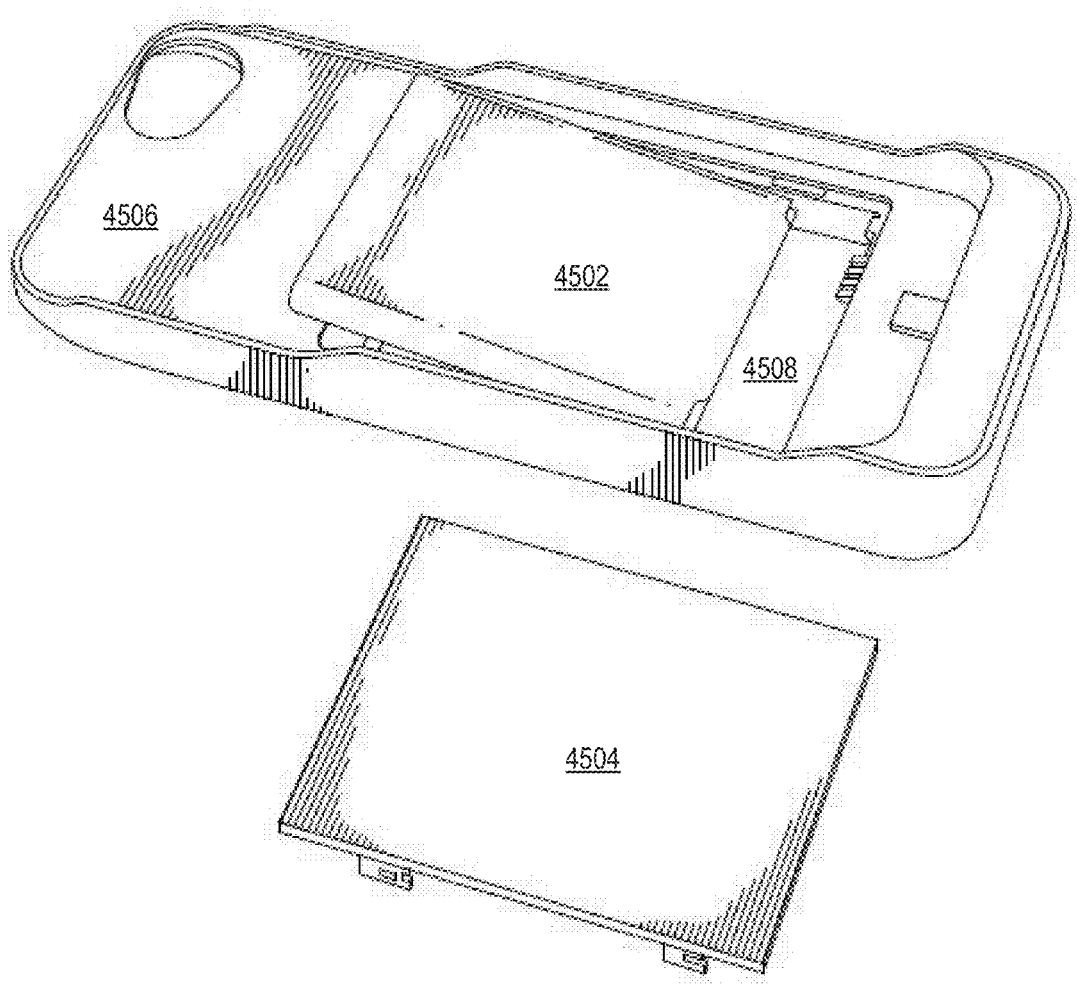
FIG. 46 depicts a partially assembled view of the reversible system having a removable battery of FIG. 45.
Figure 47:
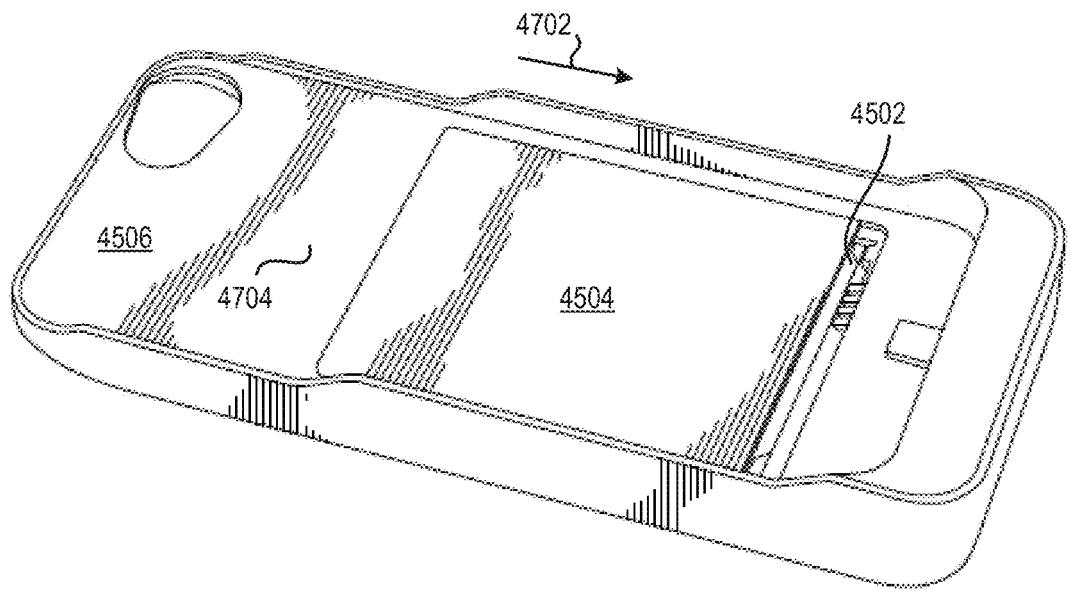
FIG. 47 depicts a partially assembled view having the battery door unsecured of the reversible system having a removable battery of FIGS. 45-46.
Figure 48:
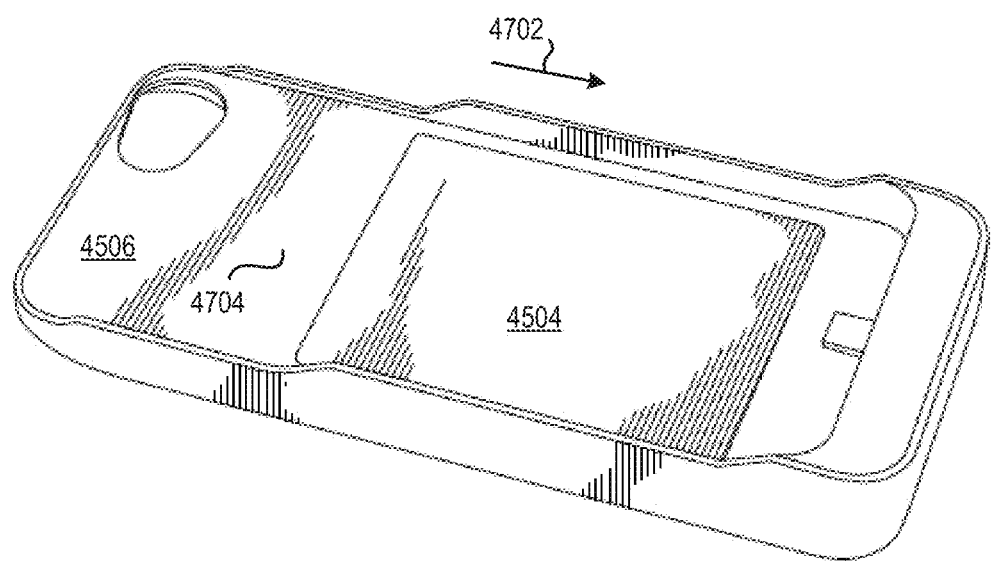
FIG. 48 depicts a partially assembled view having the battery door secured of the reversible system having a removable battery of FIGS. 45-48.
Figure 49:
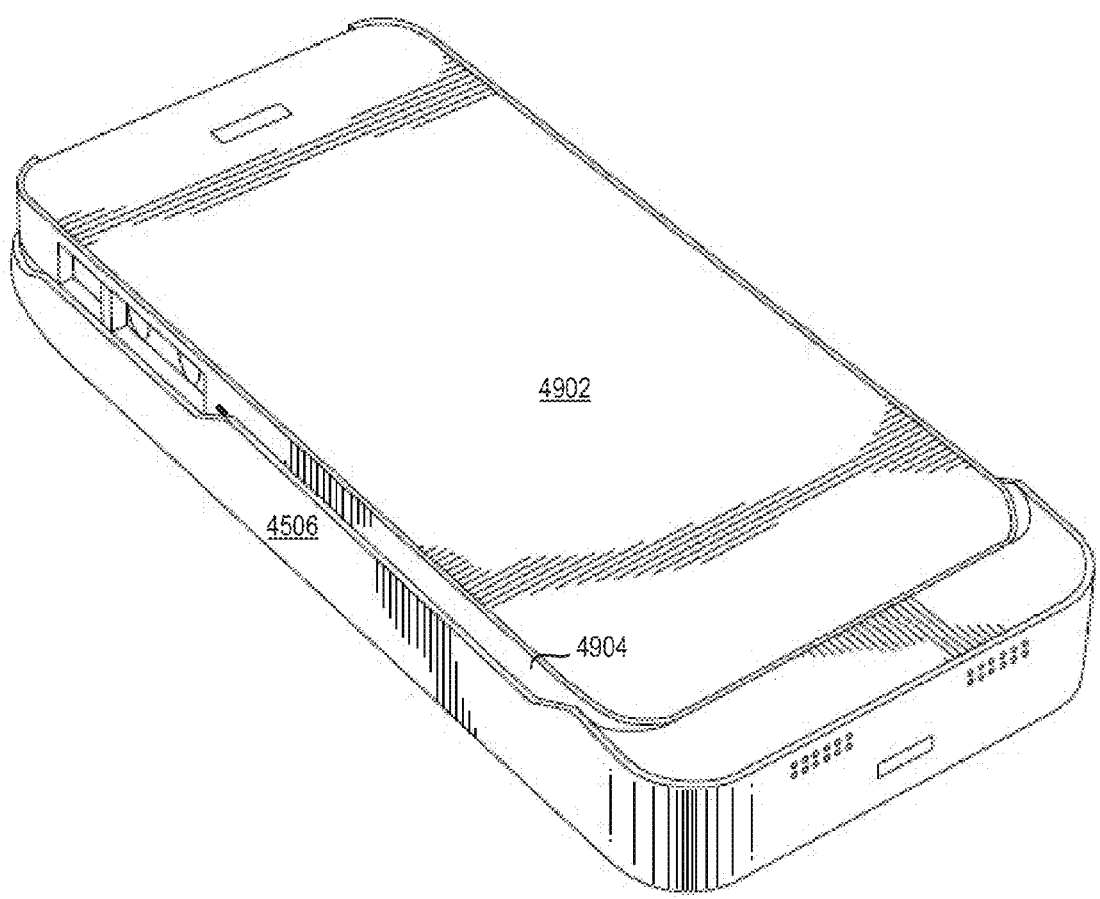
FIG. 49 depicts the reversible system of FIGS. 45-48 wherein the second case member is cradling the first case member, in one embodiment.

FIG. 45 depicts an exemplary unassembled view of a reversible system having a removable battery, in one embodiment. FIG. 46 depicts a partially assembled view of the reversible system having a removable battery of FIG. 45. FIG. 47 depicts a partially assembled view having the battery door unsecured of the reversible system having a removable battery of FIGS. 45-46. FIG. 48 depicts a partially assembled view having the battery door secured of the reversible system having a removable battery of FIGS. 45-48. FIG. 49 depicts the reversible system of FIGS. 45-48 wherein the second case member is cradling the first case member, in one embodiment. FIGS. 45-49 are best viewed together with the following description. Not all elements are labeled in FIGS. 45-49 for clarity of illustration.

As illustrated in FIGS. 45-49, another feature that may accompany the second case member is the ability to remove the additional battery to enable yet another means for remote battery charging. This feature must not encumber the proper movement between the first case member and the second case member.

Reversible system 4500 includes a removable battery 4502, a battery cover 4504, a second case member 4506 and a first case member 4904 for housing battery-operated device 4902. Battery 4502 may be similar to battery 604 and be capable of being charged by either a photovoltaic module or wall port, as discussed above. Second case member 4506 includes a recess 4508 adapted to receive battery 4502. FIG. 46 illustrates how battery 4502 may slide into recess 4508. Recess 4508 may additionally include battery interface 4510 such that when battery 4502 is seated within recess 4508, a connection between one or more of a photovoltaic module 4512 (located on the back side of second case member 4506), wall port 4514, and battery-operated device 4902 via connector 4516, for example. Photovoltaic module 4512 may be similar to any other photovoltaic module discussed herein (e.g. photovoltaic module 502). Wall Port 4514 is adapted to receive a wall charger adaptor to provide power to charge one or more of the battery 4502 and battery-operated device 4902 via connector 4516. Connector 4516 may be similar to any connector discussed herein (e.g. connector 602, 710, and 802).

Battery cover 4504 includes securing elements 4518 that are adapted to secure battery 4502 within recess 4508. For example, securing elements 4518 may be one or more protrusions that mate with intrusions on the outer edge of recess 4508 that when mated secure battery 4502 within recess 4508. FIGS. 47 and 48 illustrate that battery cover 4504 may mate with recess 4508 (e.g. using protrusions and intrusions), and then slide a direction 4702 parallel to the surface 4704 of second case member 4506. Further, as illustrated in FIG. 48, battery 4502 is completely secured within recess 4508 when the battery cover 4504 is mated.

As shown in FIG. 49, when battery 4502 is secured within recess 4508, first case member 4904 may be cradled within second case member (e.g. using any of the alignment members discussed above with reference to FIGS. 1-27) without any obstruction of battery 4502 or battery cover 4504.

Integral Case for Housing and Powering a Battery-operated Device:

The embodiments discussed below depict an integral case for housing and powering a battery-operated device. Applicants have developed a system and method for removing a photovoltaic/battery assembly to facilitate photovoltaic (PV) charging while the electronic component remains protected by a protective case and in operation or otherwise removed from direct sunlight. The system and method provides a multitude of embodiments where a removable assembly can be charged independently, or in a docking station with a similar electrical interface as the protective case. Universal PV/battery assemblies can be sized within specific families, and the PV unit can be a fixed unit, or a foldout unit otherwise stored in this same assembly.

The developed integral systems and methods for housing and powering a battery-operated electronic device overcome at least one or more of the problems discussed above. The integral systems include a photovoltaic assembly that can be releasably attached to an integral case, thereby potentially enabling the system to be charged without removing the electronic device from the case and without tethering the device by a cable. As discussed further below, the photovoltaic assembly includes a battery, one or more photovoltaic cells for charging the battery, and circuitry for controlling charging. The photovoltaic assembly is, for example, detached from the case and placed in light, such as sunlight, to charge the assembly's battery. After the photovoltaic assembly's battery is charged, the assembly is attached to the case, such that the assembly's battery powers the battery-operated electronic device and/or charges the device's battery. The case is not exposed to heat associated with charging since the photovoltaic assembly is separated from the case during charging. Therefore, the case may remain on the electronic device during photovoltaic assembly charging. Possible applications of the systems and methods include, but are not limited to, mobile telephone, tablet computers, and/or laptop computer applications.

Figure 33:
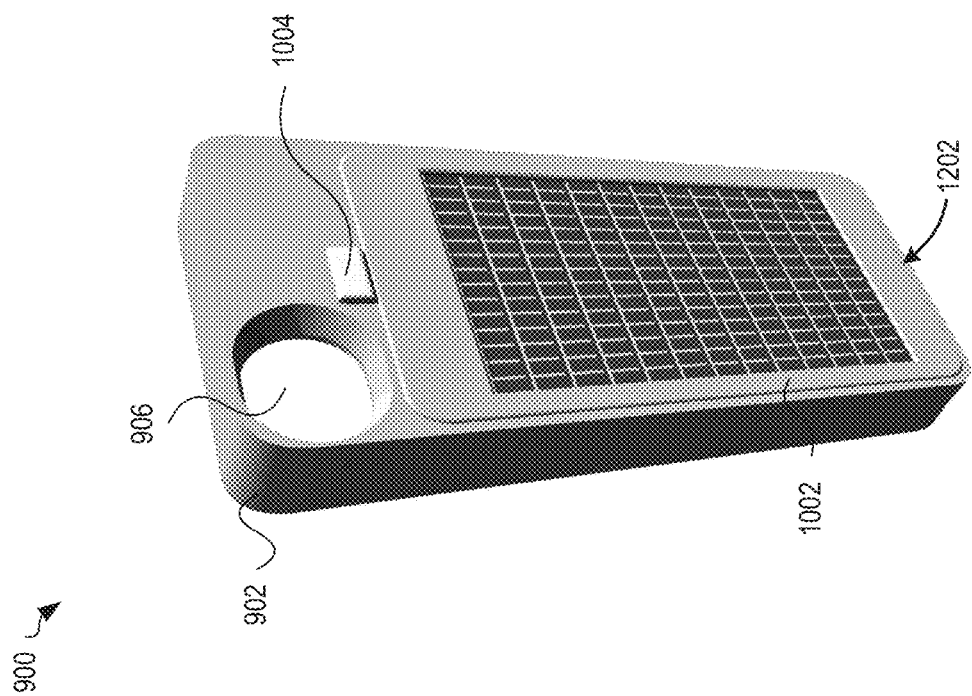
FIG. 33 shows a back perspective view of the integral system of FIG. 32.
Figure 32:
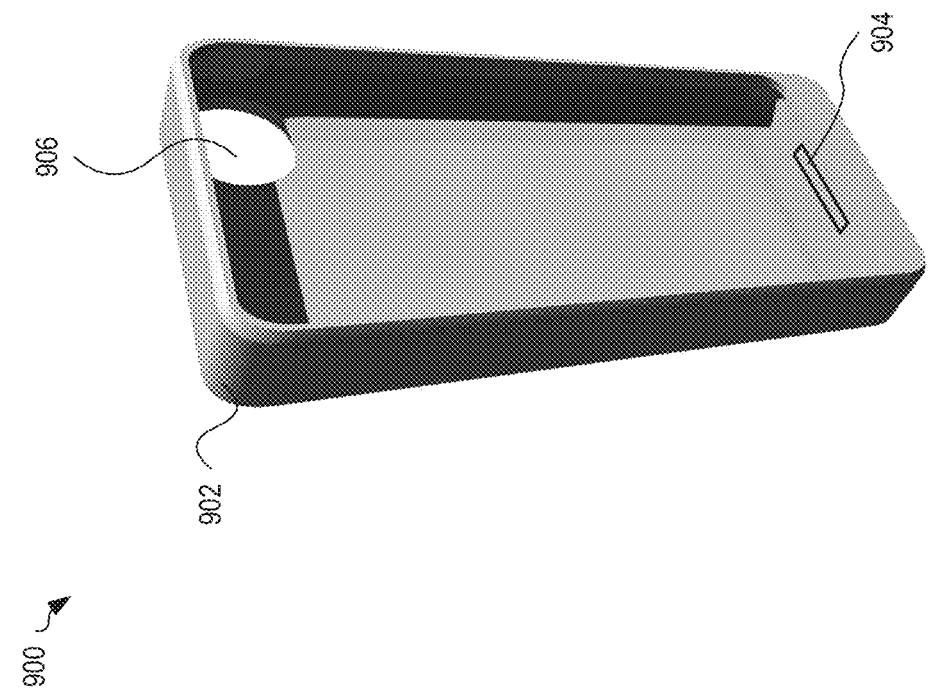
FIG. 32 shows a front perspective view of an exemplary integral system for housing and powering a battery-operated electronic device, in one embodiment.
Figure 35:
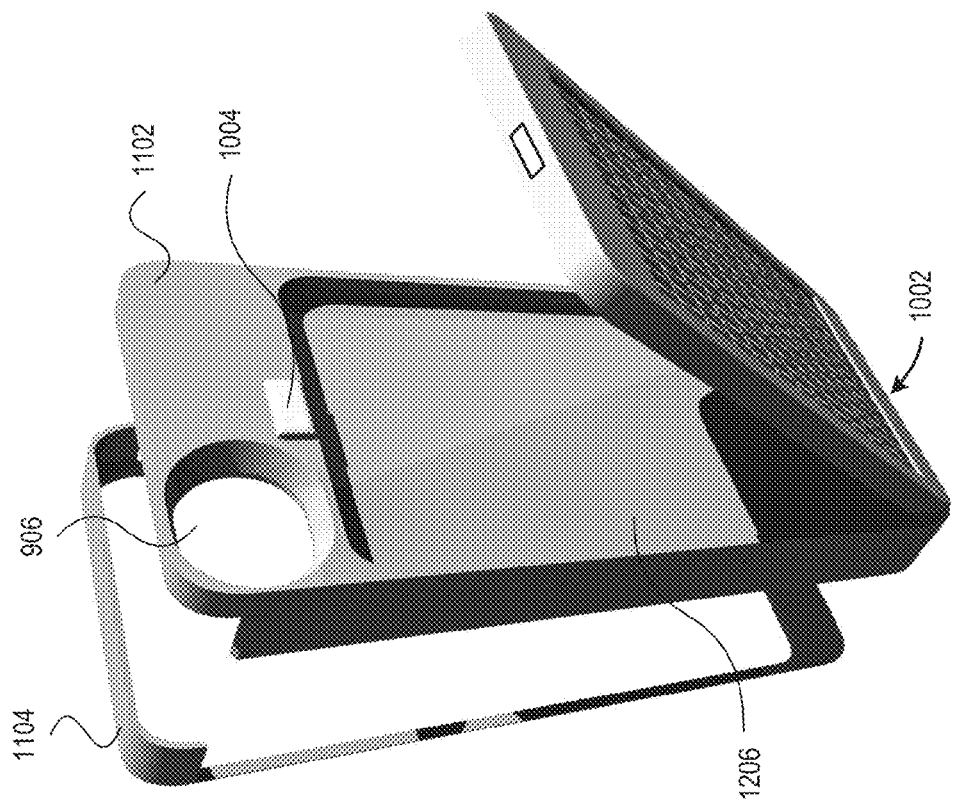
FIG. 35 shows an exploded back perspective view of the system of FIG. 32.
Figure 34:
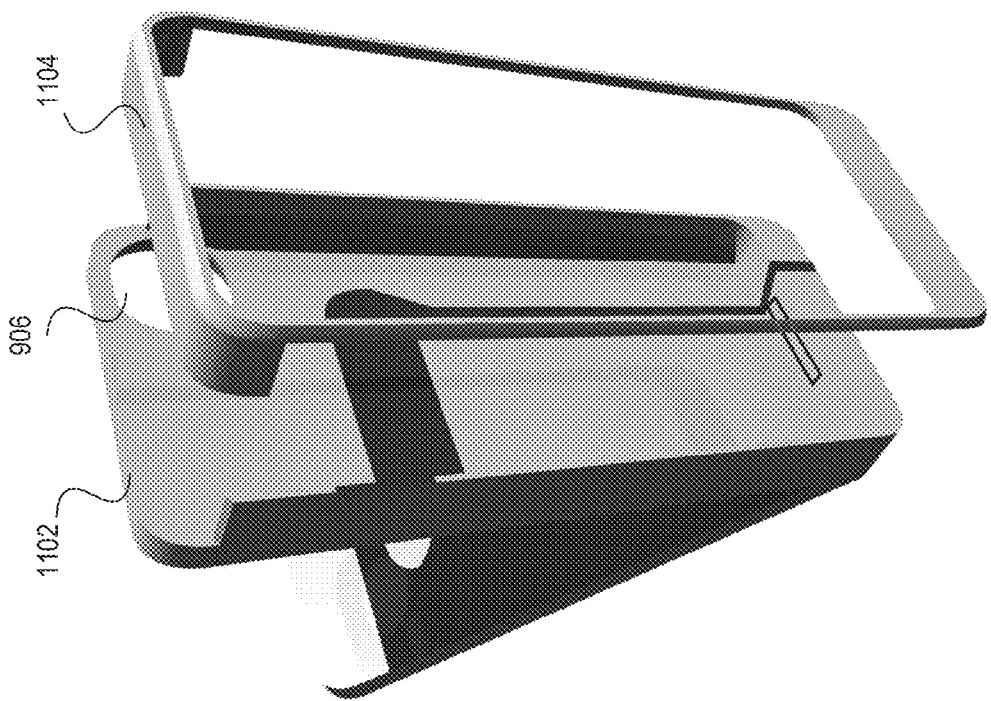
FIG. 34 shows an exploded front perspective view of the system of FIG. 32.
Figure 36:
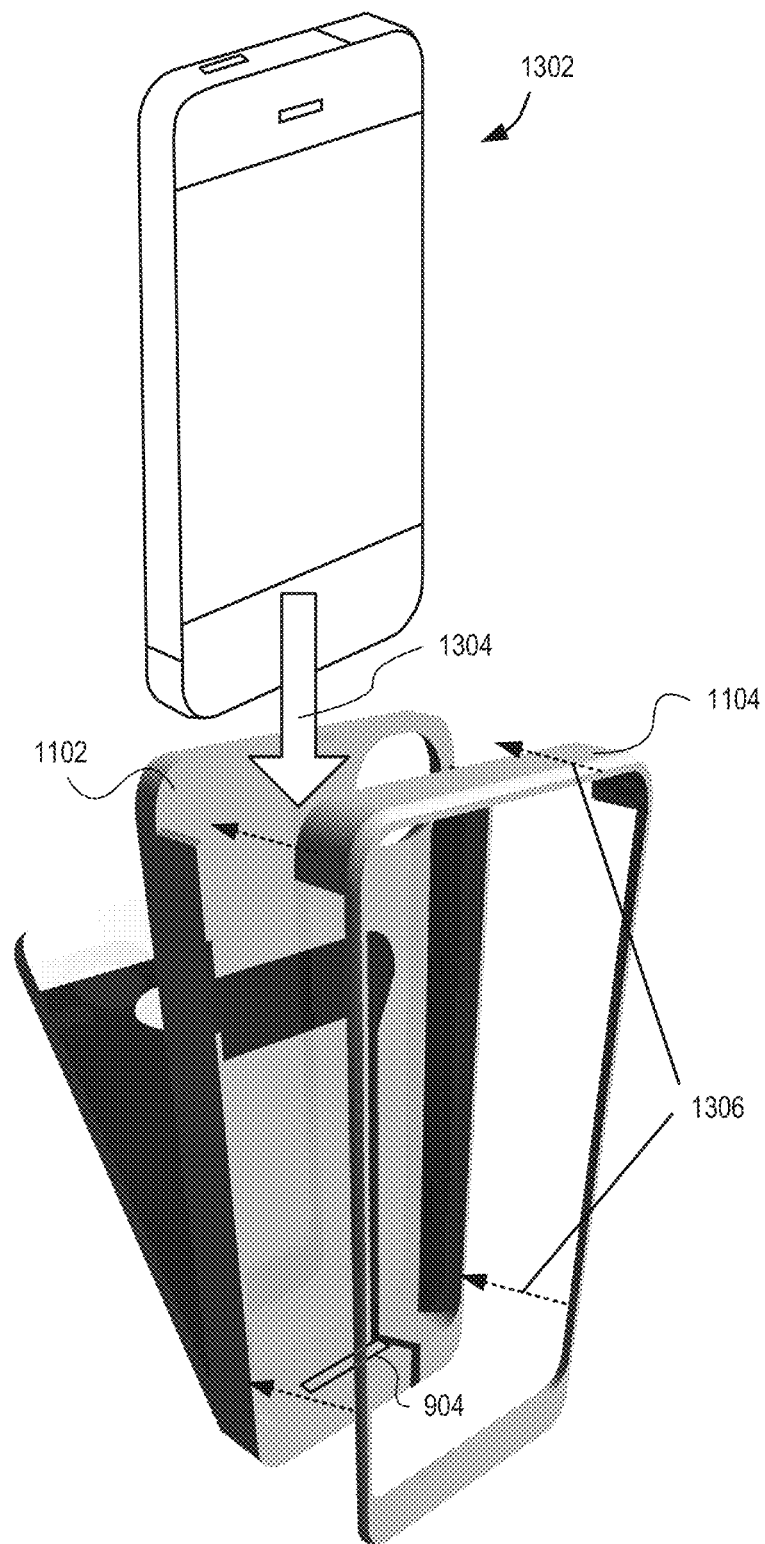
FIG. 36 illustrates one possible method for inserting a battery-operated electronic device into an integral case, in one embodiment.

FIGS. 32 and 33 show a front perspective view and a back perspective view, respectively, of an integral system 900 for housing and powering a battery-operated electronic device, such as a mobile telephone. Integral system 900 includes an integral case 902 adapted to house a battery-operated electronic device (not shown in FIGS. 32-35) and a photovoltaic assembly 1002. As discussed further below, photovoltaic assembly 1002 is adapted to releasably attach to integral case 902. FIG. 34 shows an exploded front perspective view of system 900, and FIG. 35 shows a back perspective view of the system. FIG. 36 illustrates one possible method for inserting a battery-operated electronic device 1302 into integral case 902. FIGS. 32-36 are best viewed together in the following discussion.

Integral case 902 includes a first integral case portion 1102 and a second integral case portion 1104. First integral case portion 1102 protects, for example, the sides, back and bottom of the battery-operated electronic device. Second integral case portion 1104, for example, protects the front and top of the battery-operated electronic device. First integral case portion 1102 and second integral case portion 1104 mate together (e.g. using snap latches, screws, etc.) to allow for semi-permanent protection of the battery-operated electronic device, while still permitting the battery-operated electronic device to be removed from integral case 902.

System 900 includes a first device interface connector 904 adapted to electrically couple the battery-operated electronic device to integral case 902. Device interface connector 904 may a connector adapted for interfacing with a specific electronic device. For example, device interface connector 904 may be a connector chosen from the group of connectors consisting of: a standard USB, "lightning", 30-pin, etc. connector. Additional variations of device interface connector 904 suitable for specific electronic devices will be appreciated by those skilled in the art. Device interface connector 904 is not limited in the location shown in FIG. 32, e.g. device interface connector 904 may be on the side, top or bottom of integral case 902.

FIG. 36 illustrates one possible method for inserting a battery-operated electronic device 1302 into integral case 902. In this method, battery-operated electronic device 1302 is slid into first integral case portion 1102 to couple to connector 904, as shown by arrow 1304, and second integral case portion 1104 is then mated with first integral case portion 1102, as shown by dashed arrows 1306, to cover the front of battery-operated electronic device 1302.

In certain embodiments, integral case 902 includes an aperture 906. Aperture 906 allows for functionality of certain battery-operated device features. Those skilled in the art will appreciate that there may be multiple apertures on integral case 902 to allow access to multiple battery-operated electronic device features (e.g. a camera, headphone jack, microphone jack, power adapter, microphone, etc.).

In certain embodiments, integral case 902 is not an independent component from the electronic device, but is integrated as part of the electronic device, for example as the housing of the electronic device. Therefore, battery-operated electronic device 1302 need not be inserted into integral case 902 because the integral case is manufactured as part of the housing of electronic device. In these embodiments, photovoltaic assembly 1002 may be the sole source of power for the electronic device. Alternatively, photovoltaic assembly 1002 may be an additional power source corresponding to the electronic device such that when photovoltaic assembly charging, the electronic device is still operable.

Integral case 902 typically includes a release mechanism 1004 to releasably secure a removable photovoltaic assembly 1002 to integral case 902. For example, release mechanism 1004 is a mechanism chosen from the group consisting of: a button, latch, clip, or any other mechanical apparatus for releasing (e.g. disconnecting) photovoltaic assembly 1002 from integral case 902. Release mechanism 1004 allows photovoltaic assembly 1002 to be detached from integral case 902, while allowing integral case 902 to remain covering or housing the electronic battery-operated device. Additionally, release mechanism 1004 may secure (e.g. connect) photovoltaic assembly 1002 when photovoltaic assembly 1002 is attached to integral case 902. Integral case 902 may include multiple release mechanisms 1004. In alternative embodiments, release mechanism 1004 is located on photovoltaic assembly 1002 instead of integral case 902. In certain embodiments, first integral case portion 1102 forms a recess 1206 adapted to receive photovoltaic assembly 1002, as shown in FIG. 35.

Figure 37:
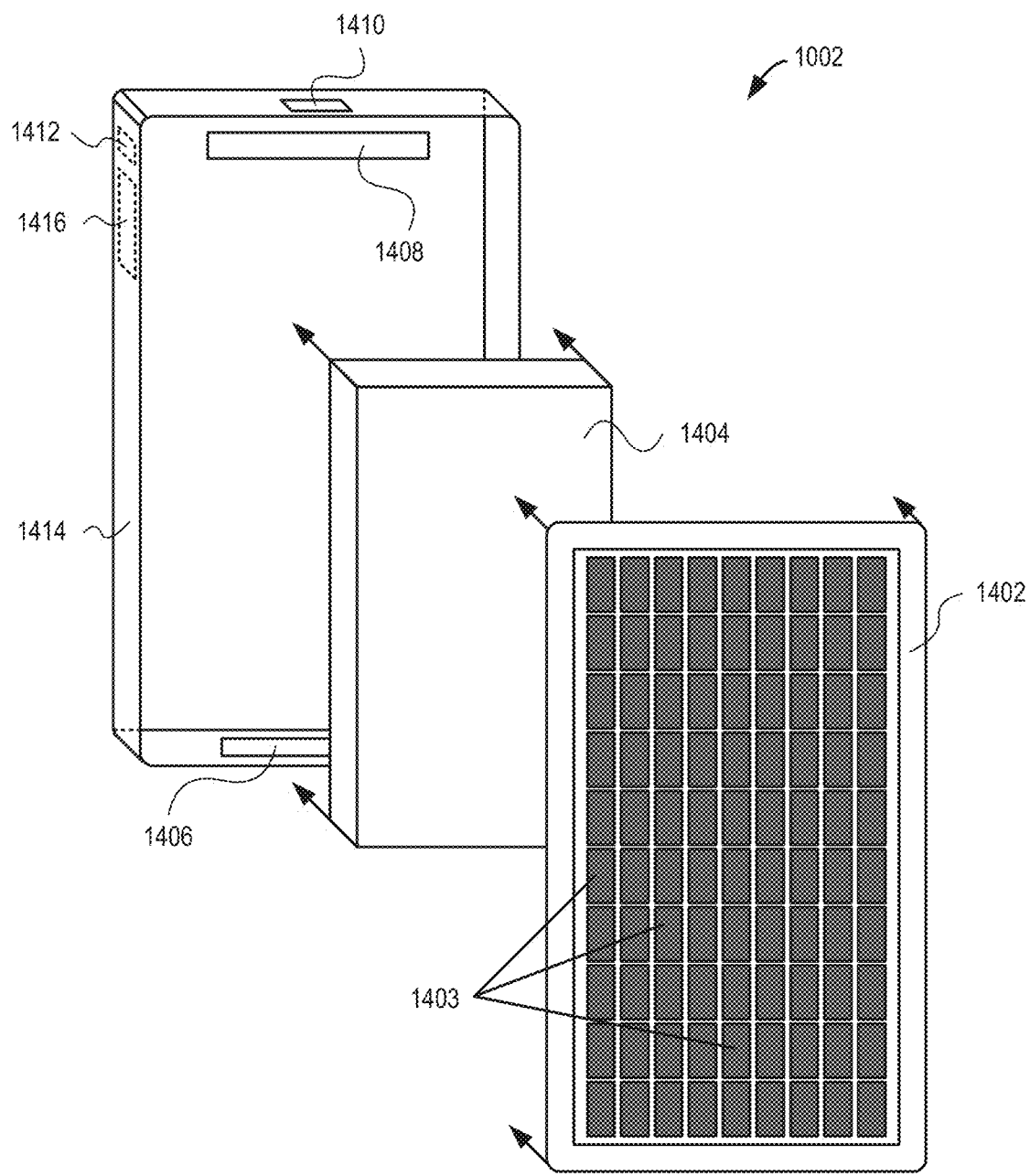
FIG. 37 shows an exemplary exploded perspective view of photovoltaic assembly, in one embodiment.

FIG. 37 shows an exploded perspective view of photovoltaic assembly 1002. Photovoltaic assembly 1002 includes a photovoltaic module 1402, a battery 1404, a processor 1408, and a photovoltaic assembly housing 1414. In one embodiment, photovoltaic module 1402 mates with photovoltaic assembly housing 1414 to encapsulate battery 1404 and processor 1408. Photovoltaic module 1402 includes one or more of photovoltaic cells 1403 electrically coupled to a battery 1404. In one embodiment, photovoltaic cells 1403 are monolithically integrated photovoltaic cells. Monolithic integration potentially enables customization of module output voltage and output current ratings during module design, thereby allowing assembly 1002 to be tailored to its intended application. Additionally, monolithic integration promotes small module size and pleasing aesthetic properties by reducing pitch between adjacent photovoltaic cells, as well by reducing or eliminating use of discrete bus bars to connect adjacent cells, relative to non-monolithically integrated photovoltaic modules.

Photovoltaic module 1402 optionally includes a transparent outer protection layer (not shown) covering photovoltaic cells 1403, thereby protecting the photovoltaic cells from environmental elements, such as moisture, dirt, and mechanical force.

Battery 1404 is a battery chosen from the group of batteries consisting of a Lithium Polymer (Li-Poly), Lithium Ion (Li-Ion), Nickel Cadmium (NiCd), or Nickel Metal Hydride (NiMH) battery. Those skilled in the art will appreciate that the battery 1404 is not limited in scope to the above listed types of batteries.

In some embodiments, battery 1404 is electrically coupled to a photovoltaic assembly interface connector 1406 located on the outer face of photovoltaic assembly housing 1414. Photovoltaic assembly interface connector 1406 is not limited in the location shown in FIG. 37, e.g. photovoltaic assembly interface connector 1406 may be on the side, top or bottom of photovoltaic assembly housing 1414. When photovoltaic assembly 1002 is attached to integral case 902, for example, photovoltaic assembly interface connector 1406 electrically couples (e.g., by physically contacting) assembly 1002 to integral case 902 via a second photovoltaic assembly interface connector 1202 associated with integral case 902. Second photovoltaic assembly interface connector 1202 is, for example, associated with the first integral case portion 1102. Second photovoltaic assembly interface connector 1202 is electrically coupled with device interface connector 904 such that when photovoltaic assembly 1002 is attached to integral case 902, battery 1404 is capable of transferring energy to battery-operated electronic device 1302.

Processor 1408 controls charging of battery 1404 using photovoltaic module 1402. In certain embodiments, processor 1408 controls when energy is transferred from battery 1404 to battery-operated electronic device 1302.

In one embodiment, photovoltaic assembly 1002 additionally includes second release mechanism 1410. For example, release mechanism 1410 is in association with photovoltaic assembly housing 1414. In one embodiment, release mechanism 1410 cooperates with release mechanism 1004 to releasably secure assembly 1002 to integral case 902. For example, in certain embodiments where release mechanism 1004 is a button, pressing release mechanism 1004 causes release mechanisms 1004, 1410 to cooperatively release photovoltaic assembly 1002 from integral case 902.

Photovoltaic assembly 1002 optionally includes an on/off switch 1412. On/off switch 1412 is located, for example, on photovoltaic assembly housing 1414 and may be electrically coupled to processor 1408. In a certain embodiment, on/off switch 1412 provides the ability to turn photovoltaic assembly 1002 off or on such that photovoltaic module 1402 is incapable of charging battery 1404, and/or such that battery 1404 is incapable of transferring energy to battery-operated device 1302.

Photovoltaic assembly 1002 optionally includes charge status notification 1416. Charge status notification 1416 is located, for example, on photovoltaic assembly housing 1414 and may be electrically coupled to processor 1408. In one embodiment, charge status notification 1416 is controlled by processor 1408 and displays the charge status of battery 1404. Charge status notification 1416 is a visual representation (e.g., LED or LCD screen) of the amount of charge in battery 1404. In some embodiments, charge status notification 1416 only periodically displays the amount of charge in battery 1404 to conserve energy.

Because photovoltaic assembly 1002 is releasably attached to integral case 902, photovoltaic assembly 1002 may be charged by incidental light (e.g., sunlight) while not attached to integral case 902. By charging photovoltaic assembly 1002 while the assembly is not attached to integral case 902, battery-operated electronic device 1302 does not encounter excessive temperatures caused by leaving battery-operated electronic device 1302 under sunlight. Therefore, battery-operated electronic device 1302 will not trigger a shutdown sequence in order to prevent thermal damage to the device, and thus battery-operated electronic device 1302 remains active. Additionally, battery-operated electronic device 1302 may still be protected by integral case 902 while photovoltaic assembly 1002 is being charged.

Figure 38:
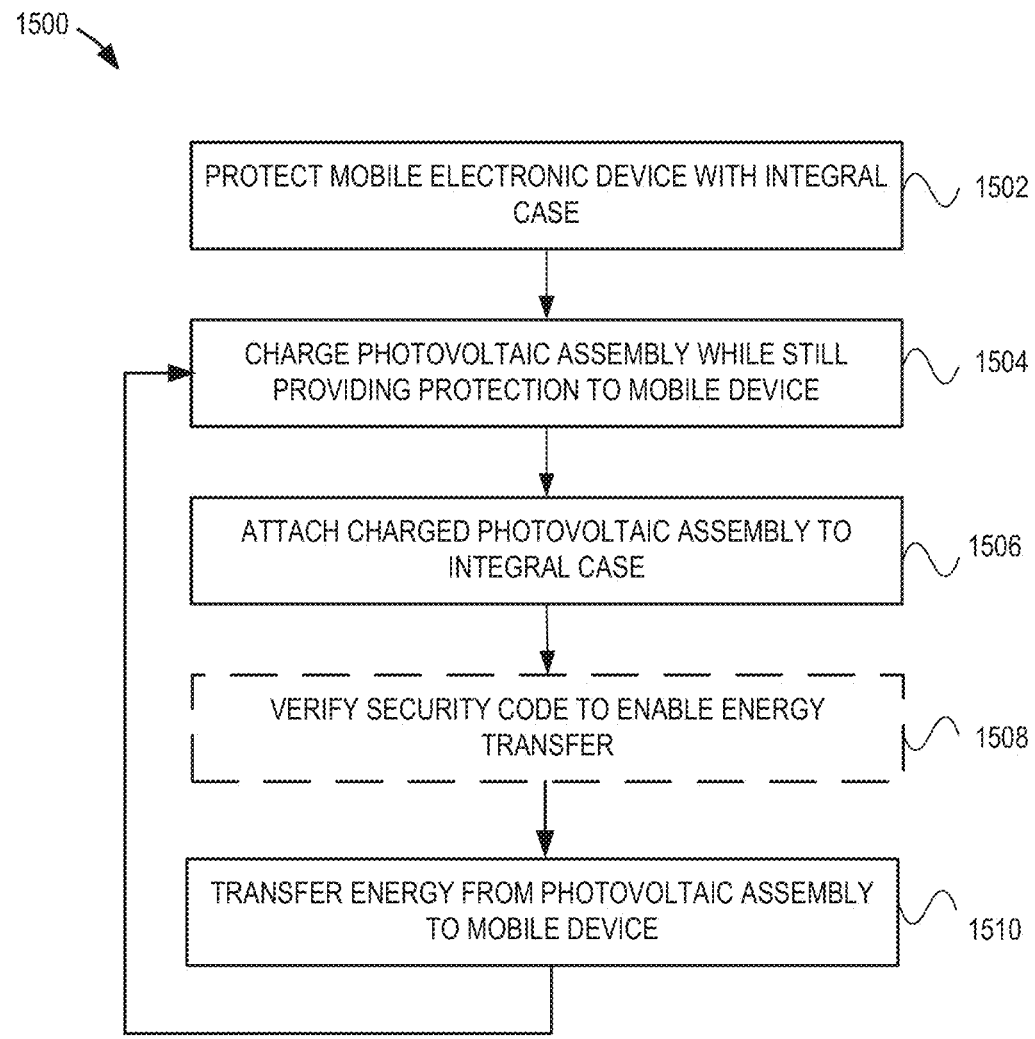
FIG. 38 shows an exemplary method for protecting a battery-operated electronic device and providing additional energy to an electronic device, in one embodiment.

FIG. 38 shows an exemplary method 1500 for protecting a battery-operated electronic device and providing additional energy to the electronic device. Method 1500 may be performed using integral case 902 and associated photovoltaic assembly 1002 of FIGS. 32-37. In step 1502, method 1500 protects a battery-operated electronic device using an integral case 902. In one example of step 1502, battery-operated electronic device 1302 is inserted into the first integral case portion 1102, and the second integral case portion 1104 is mated with the first integral case portion 1102, such that battery-operated device 1302 is protected on all sides.

In step 1504, method 1500 charges a photovoltaic assembly. For example, in step 1504, photovoltaic assembly 1002 is detached from integral case 902 using release mechanism 1004. Photovoltaic assembly 1002 is then charged by placing photovoltaic assembly 1002 under incident light, such as sunlight. In one embodiment, an alternate photovoltaic assembly (not shown), having the same size and specifications as the photovoltaic assembly 1002 removed, has already been charged by being placed under incident light. Alternatively, the removed photovoltaic assembly 1002, or an alternate photovoltaic assembly (not shown), having the same size and specifications as the removed photovoltaic assembly 1002, is charged using a wall adapter that connects with photovoltaic assembly interface connector 1406.

By having a photovoltaic assembly releasably attached to the integral case, one or more significant advantages may be achieved that could not be achieved using existing photovoltaic battery-operated device cases. While the photovoltaic assembly is being charged, the integral case remains on the battery-operated electronic device. Therefore, the battery-operated device remains protected until the integral case is specifically removed. Furthermore, the battery-operated device is not subjected to excessive thermal loads while the photovoltaic assembly is being charged. Therefore, the battery-operated device does not enter a "shutdown" sequence due to the battery-operated device getting too hot.

In step 1506, method 1500 attaches a charged photovoltaic assembly to the integral case 902. In one embodiment, the same photovoltaic assembly that was detached in step 1504 is attached to integral case 902 after the photovoltaic assembly has been charged in step 1504. In an alternate embodiment, an alternate photovoltaic assembly (not shown), having the same size and specifications as the removed photovoltaic assembly that has been previously charged, is attached to integral case 902.

Step 1508 is optional. In step 1508, the photovoltaic device receives a security code to verify authorized use. For example, a security code may be entered using a plurality of buttons (not shown) on certain embodiments of photovoltaic assembly 1002. In one embodiment, where the security code matches a predetermined correct security code value, the photovoltaic assembly is enabled to permit energy transfer from the photovoltaic device 1002 to the electronic device. Step 1508 thereby prevents unauthorized use and reduces potential theft of the photovoltaic assembly 1002, for example. In another embodiment, where the security code matches a predetermined correct security code value, the photovoltaic assembly is enabled to permit charging of the photovoltaic assembly.

In step 1510, energy is transferred from the interchangeable photovoltaic assembly 1002 to battery-operated electronic device 1302. For example, energy that is stored in battery 1404 may be transferred to the battery of battery-operated electronic device 1302. When battery 1404 is to be recharged, method 1500 repeats at step 1504.

Figure 39:
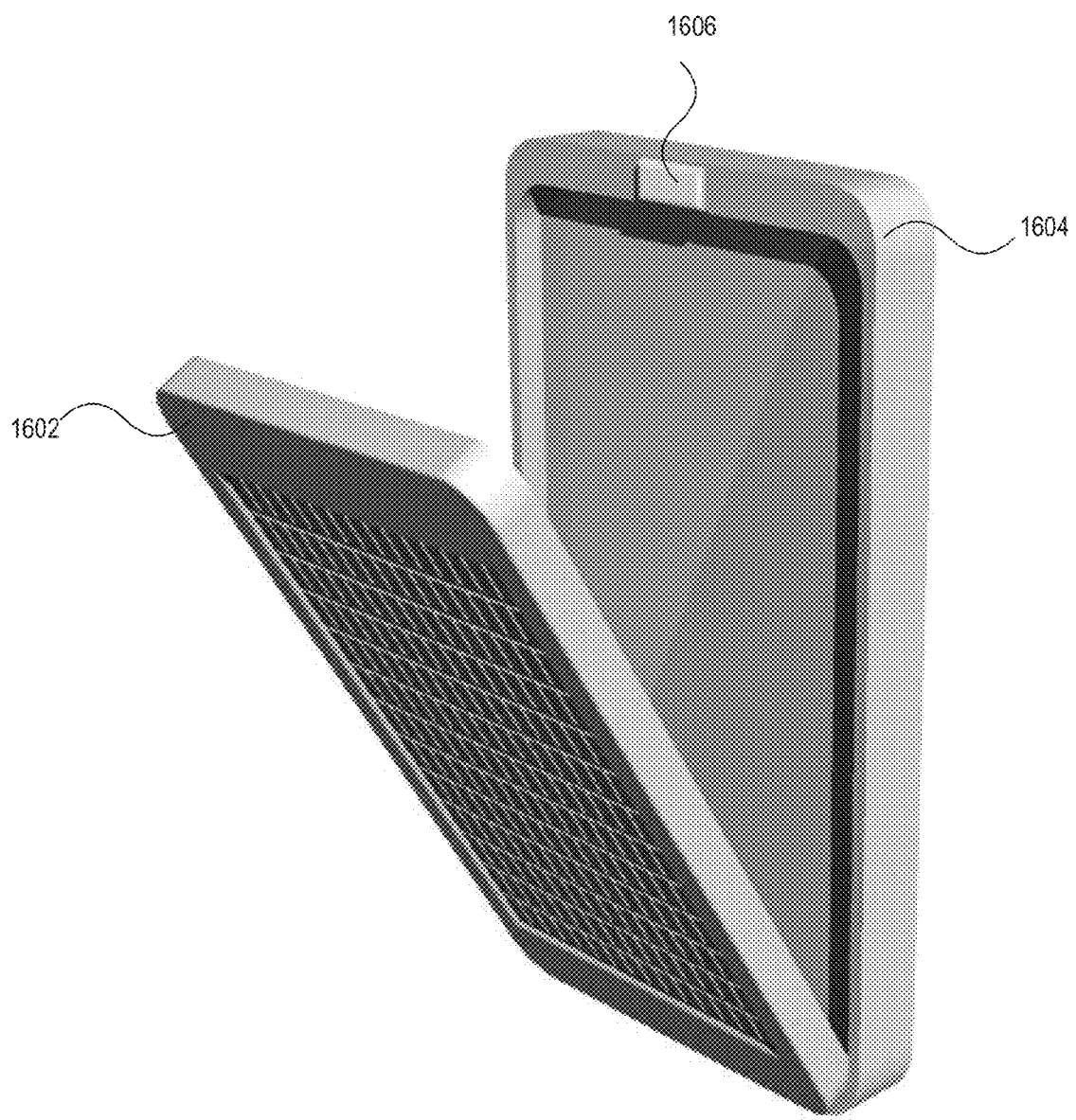
FIG. 39 depicts a photovoltaic assembly in a stand-alone docking station in lieu of an integral case, in one embodiment.

FIG. 39 depicts a photovoltaic assembly 1602 in a stand-alone docking station 1604 in lieu of an integral case. For example, photovoltaic assembly 1602 may be the same as photovoltaic assembly 1002. As shown, docking station 1604 may include a release mechanism 1606. For example, release mechanism 1606 may be similar to release mechanism 1004. In certain embodiments, docking station 1604 provides additional means for charging, e.g. a USB connection or a separate DC charging adapter or a wall port adapter. In certain embodiments, docking station 1604 also provides the ability to transfer power already stored in, or generated by photovoltaic assembly 1602 to a suitable device (not shown) such as a tablet, GPS, power tool, or other electronic device. For example, docking station 1604 may connect to the suitable device using USB connection or alternate form of electrical coupling.

Figure 40:
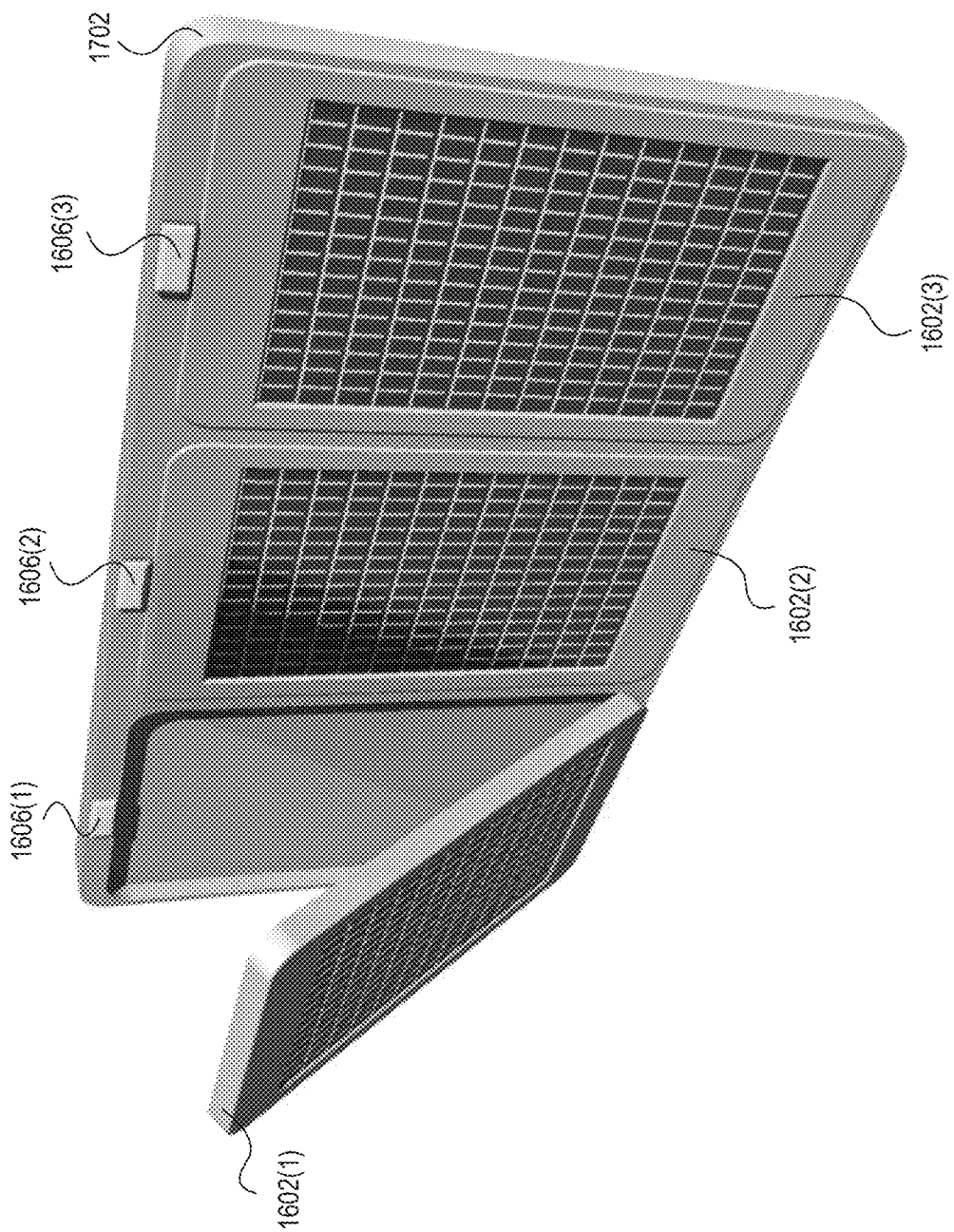
FIG. 40 depicts a plurality of photovoltaic assemblies in a docking station, in one embodiment.

FIG. 40 depicts a plurality of photovoltaic assemblies 1602(1)-1602(3) in a docking station 1702, in one embodiment. Docking station 1702 is similar to docking station 1604, except that docking station 1702 allows for a plurality of photovoltaic assemblies 1602(1)-1602(3) to be charged at the same time. Similar to docking station 1604, in certain embodiments, docking station 1702 may also provide the ability to transfer power already stored in, or generated by photovoltaic assemblies 1602(1)-1602(3) to a suitable device (not shown) such as a tablet, GPS, power tool, or other electronic device. For example, docking station 1702 can be created to incorporate a predetermined number of photovoltaic assemblies 1602 to obtain a requisite power level in order to fully charge and/or power a specific electronic device.

Figure 41:
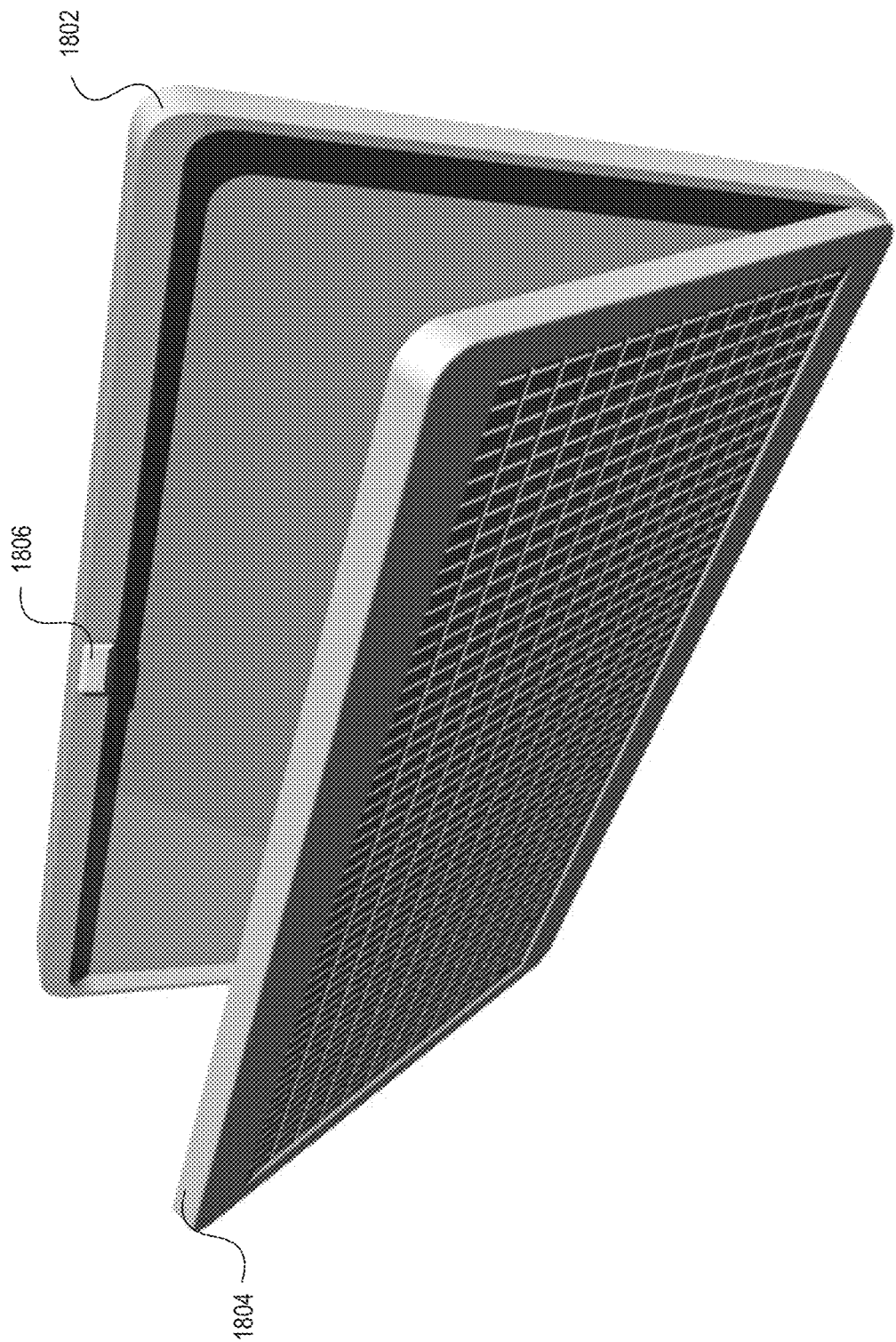
FIG. 41 depicts a larger docking station that accommodates a larger photovoltaic assembly, in one embodiment.

FIG. 41 depicts a larger docking station 1802 that accommodates a larger photovoltaic assembly 1804. Docking station 1802 may additionally include one or more release mechanisms 1806, similar to release mechanism 1004. Larger photovoltaic assembly 1804 is similar to photovoltaic assembly 1002 and 1602; however, assembly 1804 provides the capability to charge and power larger, more power intensive electronic devices. Similar to docking stations 1604 and 1702, docking station 1802 may provide additional means for charging, e.g. a USB connection or a separate DC charging adapter. In certain embodiments, docking station 1802 may also provide the ability to transfer power already stored in, or generated by photovoltaic assembly 1804 to a suitable device (not shown) such as a tablet, GPS, power tool, or other electronic device. The size and shape of docking station 1802 and photovoltaic assembly 1804 may be predetermined to obtain a requisite power level in order to fully charge and/or power a specific electronic device.

Figure 42:
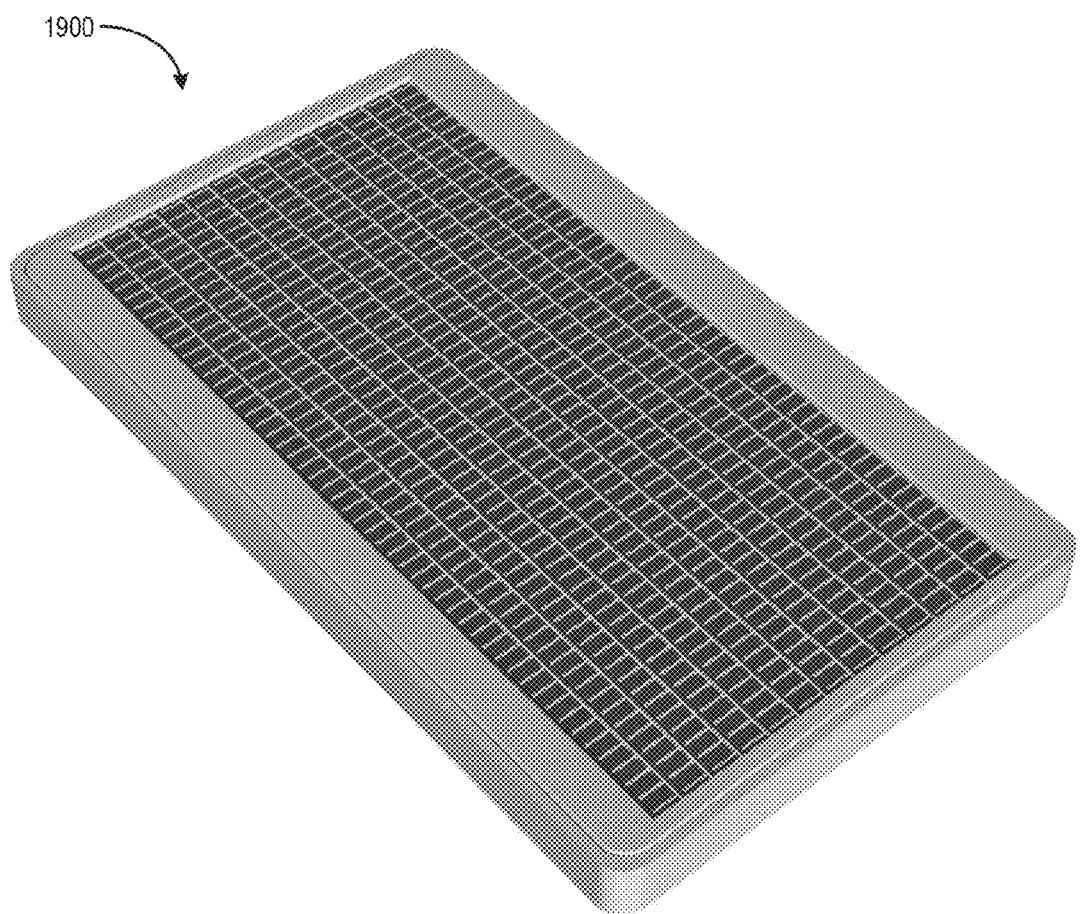
FIG. 42 depicts an exemplary foldout photovoltaic assembly including a foldout array, in one embodiment.
Figure 43:
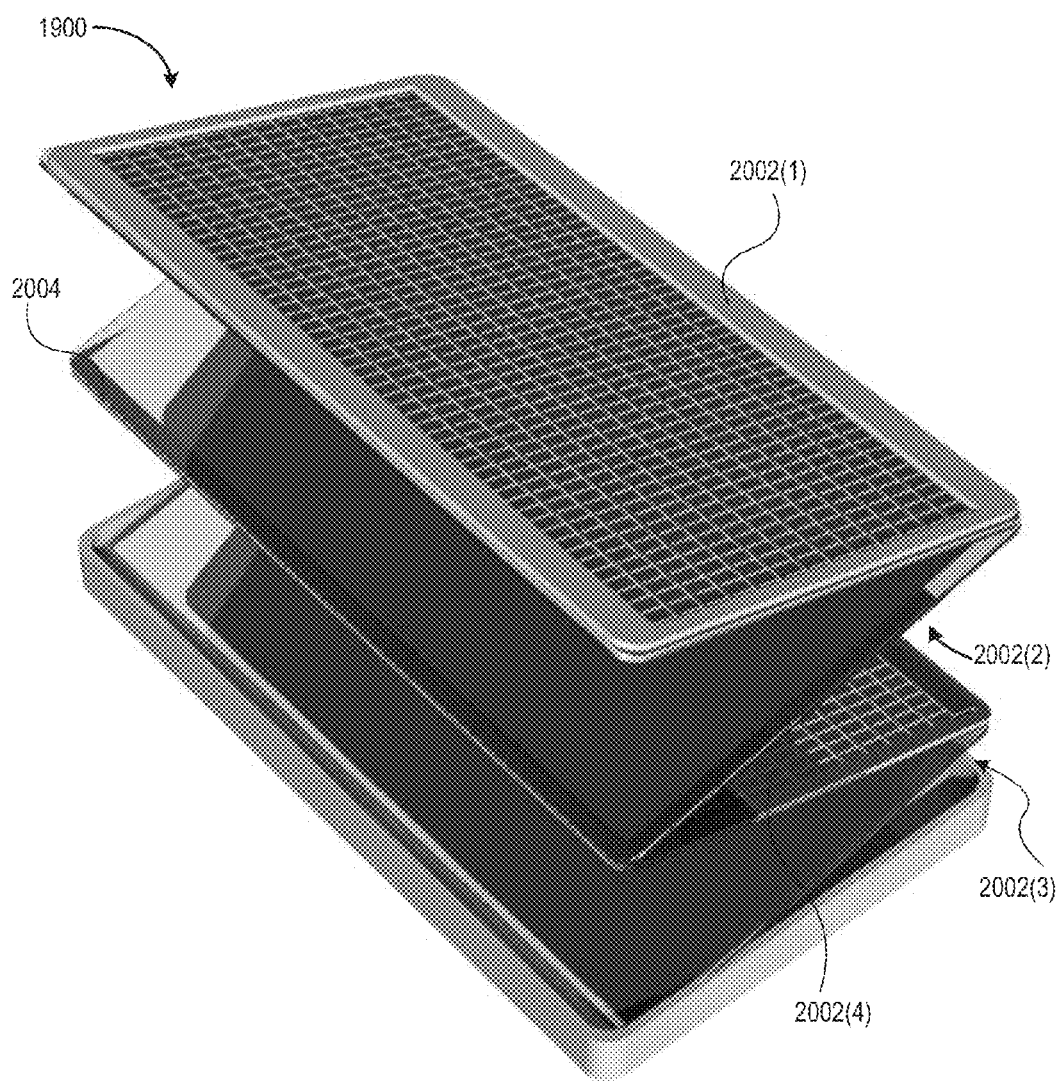
FIG. 43 depicts the foldout photovoltaic assembly of FIG. 42 being partially unfolded and including a plurality of photovoltaic modules.
Figure 44:
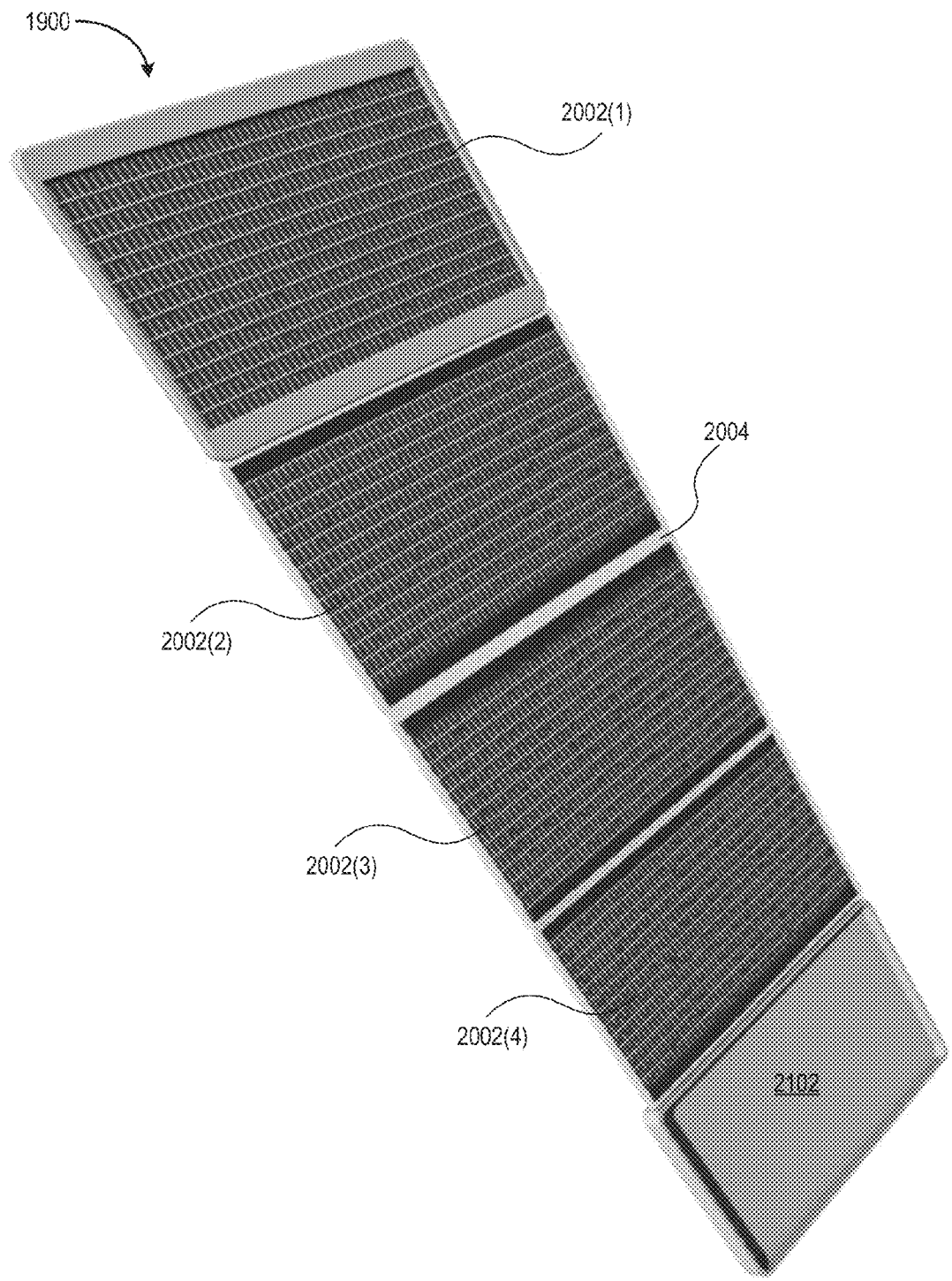
FIG. 44 depicts the foldout photovoltaic assembly completely unfolded.

FIG. 42 depicts an exemplary foldout photovoltaic assembly 1900 including a foldout array. FIG. 43 depicts foldout photovoltaic assembly 1900 being partially unfolded and including a plurality of photovoltaic modules 2002, in one embodiment. FIG. 44 depicts the foldout photovoltaic assembly 1900 completely unfolded. FIGS. 42-44 are best viewed together with the following description.

Foldout photovoltaic assembly 1900 may take the place of photovoltaic assemblies 1002, 1602, or 1804. In one embodiment, foldout photovoltaic assembly 1900 cooperates with protective case 902. In another embodiment, foldout photovoltaic assembly 1900 cooperates with docking station 1604 or docking station 1702. In yet another embodiment, foldout photovoltaic assembly 1900 cooperates with docking station 1802.

FIG. 43 depicts foldout photovoltaic assembly 1900 partially unfolded. As shown in FIG. 43, foldout photovoltaic assembly 1900 includes a plurality of photovoltaic modules 2002(1) through 2002(4). Additionally, foldout photovoltaic assembly 1900 includes a rechargeable battery (not labeled) electrically coupled to at least one of the plurality of photovoltaic modules 2002 such that the battery may be charged by the plurality of photovoltaic modules 2002. The plurality of photovoltaic modules 2002 are all electrically coupled together, each having a hinging means 2004. Hinging means 2004 allows each photovoltaic module 2002 to stack together within photovoltaic device 1900. For example, the battery may be charged using a single photovoltaic module, e.g. 2002(1), or the modules may be unfolded such that a plurality of photovoltaic modules 1202 are used to charge foldout photovoltaic assembly 1900.

FIG. 44 depicts foldout photovoltaic assembly 1900 completely unfolded. As shown in FIG. 44 the plurality of photovoltaic modules 2002 face the same direction when unfolded. Furthermore, by incorporating a plurality of photovoltaic modules 2002, foldout photovoltaic assembly 1900, when unfolded, has a significantly larger surface area of photovoltaic cells. The larger surface area provides the ability to charge the battery more quickly. Furthermore, the larger surface area provides the ability to charge batteries with larger power capacities, thereby allowing for a greater range of electronic devices.

In certain embodiments, one or more photovoltaic modules 2002 are replaced with an alternate function panel. For example, the alternate function panel may be a reflective device, such as a mirror, to concentrate ambient light on modules 2002. Alternately, the alternate function panel may be an electronically-addressable display to verify device performance such as battery power, charging power, etc. Additionally, although each photovoltaic module 2002 is shown as disposed on the same side of the photovoltaic assembly 1900, photovoltaic modules 2002 could be alternatively disposed on different sides of assembly 1900 without departing from the scope hereof.

In certain embodiments when photovoltaic assembly 1900 is unfolded, one or more of photovoltaic modules 2002, or the unveiled portion 2102 of photovoltaic assembly 1900 may incorporate a picture holder such that a user may insert a photo in order to personalize photovoltaic assembly 1900.

Interchangeable Features of Integral and Reversible Systems:

It is noted that certain elements of either the integral or reversible systems discussed above can adapted to be incorporated into the other system without departing from the scope herein.

For example, the removable photovoltaic assembly 1002 may be adapted to not only interact with the integral case, as discussed above, but additionally with the reversible case as discussed in reference to FIGS. 1-31. For example, the photovoltaic assembly 1002 may take the place of photovoltaic module 502. Additionally, in some embodiments, the second case member (i.e. 106, 11906, 2206, 2306, 2406, 506, 706, and 816) is adapted to incorporate the releasable photovoltaic assembly 1002.

As another example, in the embodiments above, foldout assembly 1900 is depicted as being a part of integral case 902. However, the foldout assembly is not limited in scope. For example, PV module 502 of reversible system 500 may be replaced with a foldout array. Accordingly, reversible system 500 may include a fold out array that unfolds from the reversible case to increase the surface area of the photovoltaic module.

Combinations of Features

Features described above as well as those claimed below may be combined in various ways without departing from the scope hereof. The following examples illustrate some possible combinations:

(A) A reversible system for housing a battery-operated device may include a first case member adapted to house the battery-operated device and a second case member adapted to cradle the first case member in at least two orientations.

(B) In the reversible system denoted as (A), the first case member may have a first length, a first width perpendicular to the first length, and a first plurality of sides may have a first depth orthogonal to the first width and first depth; and the second case member may have a second width, a second length, and a bottom portion having a second depth orthogonal to the second width and second depth.

(C) In either of the reversible systems denoted as (A) or (B), the first case member may be a thin case member made of plastic, rubber, silicon, metal or other material that provides protection to battery-operated device.

(D) In any of the reversible systems denoted as (A) through (C), the first case member may include at least one first alignment member; and the second case member may include at least one second alignment member that compliments the first alignment member when the first case member is joined to the second case member.

(E) In any of the reversible systems denoted as (A) through (D), the first alignment member may include at least one groove on the first case member.

(F) In the reversible system denoted as (E), the second alignment member may include at least one tab adapted to dispose in the at least one groove.

(G) In the reversible system denoted as (F), the at least one groove includes two grooves, each of the two grooves disposed toward each outer edge of the side of the first case member at an equivalent distance from the front and rear edges of the first case member, respectively.

(H) In the reversible system denoted as (F), the at least one groove is a single groove located on the elongated axis of the first case member at an equivalent distance from the front and rear edges of the first case member, wherein the equivalent distance is one half of the first depth of the first case member.

(I) In either of the reversible systems denoted as (G) or (H), a third depth and height of the tab is adapted according to the equivalent distance.

(J) In the reversible system denoted as (D), the first alignment member and second alignment member may include an adjoining convex and concave structure along the elongated axis of the first and second case members, respectively.

(K) In the reversible system denoted as (D), the first and second alignment members may include a channel located on second case member for the entire first case member to cradle into.

(L) In the reversible system denoted as (D), the first and second alignment members may include protrusions from the back of the first case member, and intrusions in the face of the second case member, respectively.

(M) In the reversible system denoted as (D), the first and second alignment members may include magnetic attraction to cradle first case member to second case member.

(N) In any of the reversible systems denoted as (D) through (M), at least one of first and second alignment members may be adapted to prevent incorrect orientation of first case member when cradled to second case member.

(O) In any of the reversible systems denoted as (D) through (N), the first and second alignment members may be adapted to releasably secure the first case member to the second case member such that the second case member cradles the first case member in at least two orientations.

(P) In any of the reversible systems denoted as (A) through (O), the second case member may further include a battery.

(Q) In the reversible system denoted as (P), the second case member may further include a recess adapted to fit the battery, and a battery door adapted to secure the battery within the recess.

(R) In the reversible system denoted as (Q), the battery door may include protrusions adapted to mate with intrusions and secure the battery when the battery door is slid in a direction parallel the surface of the second case member.

(S) In any of the reversible systems denoted as (P) through (R), the battery may include a rechargeable battery adapted to recharge from one or more of a wall port or a photovoltaic module.

(T) In any of the reversible systems denoted as (A) through (P), the second case member may further include a photovoltaic module configured to at least partially charge one or more of the battery-operated device or the battery.

(U) In the reversible system denoted as (T), the photovoltaic module may include at least one photovoltaic cell electrically coupled to at least one of the battery and the battery-operated device.

(V) In the reversible system denoted as (U), the at least one photovoltaic cell may include a plurality of monolithically integrated thin film photovoltaic cells.

(W) In any of the reversible systems denoted as (T) through (V), the photovoltaic module may include a fold out array including at least one foldout portion having a plurality of the photovoltaic cells electrically coupled to at least one of the battery and battery-operated device and adapted to unfold from a photovoltaic assembly housing.

(X) In the reversible system denoted as (W), at least one of the foldout portions may include an alternate function portion.

(Y) In any of the reversible systems denoted as (T) through (W), the photovoltaic module may further include a transparent outer protection layer providing protection to at least one photovoltaic cell.

(Z) In any of the reversible systems denoted as (P) through (U), the second case member may further include a connector.

(AA) In the reversible system denoted as (Z), the connector may include a reversible connector centrally located on the bottom portion along the second width.

(BB) In the reversible system denoted as (Z), the connector may include a variably located connector including at least one second connector port, and a connector adaptor configured to be inserted in one of the at least one second connector port.

(CC) In the reversible system as (BB), the connector adaptor may be reversible.

(DD) In the reversible system denoted as (BB), the connector adaptor may be asymmetrical and adapted to insert into the at least one second connector port in a plurality of orientations.

(EE) In the reversible system denoted as (Z), the connector may include an intermediary connector subsystem including: (1) a first intermediary connector located on the first case member and adapted to couple to the battery-operated device charging port, and (2) a second intermediary connector located on second case member adapted to couple to the battery and adapted to couple to the first intermediary connector, when the first case member is cradled in second case member.

(FF) In the reversible system denoted as (EE), the first and secondary intermediary connectors may couple via at least one of a conductor and an intermediary connector adaptor.

(GG) In any of the reversible systems denoted as (P) through (EE), the second case member may further include a wall port.

(HH) Any of the reversible systems denoted as (P) through (EE) may further include a processor electrically coupled to one or more of the photovoltaic module, the battery, the battery-operated device, the wall port, and the connector, to control operation of the reversible system.

(II) Any of the reversible systems denoted as (A) through (HH) may be structurally configured such that, in one orientation, a screen of the battery-operated device faces outward away from the second case member, and in another orientation the screen faces inward toward the second case member.

(JJ) Any of the reversible systems denoted as (A) through (HH) may further include an orientation detection circuit adapted to detect orientation of the first case member to the second case member and alter the functionality of one or more of the battery-operated device and the second case member.

(KK) Any of the reversible systems denoted as (A)-(JJ) may further include at least one aperture located on at least one of the first case member and the second case member, where the at least one aperture is adapted to allow access to at least one feature of the battery-operated device.

(LL) An integral system for housing and powering a battery-operated device may include: a first integral case portion; a second integral case portion adapted to mate with the first integral case portion such that a battery-operated device is semi-permanently secured within the integral case; a first device interface connector adapted to electrically couple a battery-operated device to the integral case; a photovoltaic assembly; and a release mechanism to releaseably secure the photovoltaic assembly to the integral case.

(MM) In the integral system denoted as (LL), the release mechanism may include a plurality of release mechanisms.

(NN) In either of the integral systems denoted as (LL) or (MM), the photovoltaic assembly may be adapted to fit within a recess of within the integral case.

(OO) In any of the integral systems denoted as (LL) through (OO), the photovoltaic assembly may include: a photovoltaic module, a rechargeable battery adapted to at least partially recharge via at least one of the photovoltaic module and a wall port; a photovoltaic assembly housing; a processor configured to control the charging of the battery; and a photovoltaic interface connector adapted to electrically couple the photovoltaic assembly to battery-operated device via first device interface connector such that power may be transferred from battery to battery-operated device.

(PP) In the integral system denoted as (OO), the photovoltaic module may include at least one photovoltaic cell.

(QQ) In the integral system denoted as (PP), the at least one photovoltaic cell may include a plurality of monolithically integrated thin film photovoltaic cells.

(RR) In any of the integral systems denoted as (NN) through (QQ), the photovoltaic module may include a foldout array including at least one foldout portion having a plurality of photovoltaic cells electrically coupled to the battery and adapted to unfold from the photovoltaic assembly housing.

(SS) In the integral system denoted as (RR), at least one of the at least one foldout portion may be an alternate function portion.

(TT) In any of the integral systems denoted as (PP) through (SS), the photovoltaic module may further include a transparent outer protection layer.

(UU) In any of the integral systems denoted as (OO) through (TT), the processor may be further configured to control transfer of energy from the battery to the battery-operated device.

(VV) Any of the integral systems denoted as (LL) through (UU) may further include at least one aperture adapted to provide access to at least one feature of the battery-operated device.

(WW) Any of the integral systems denoted as (LL) through (WW) may further include an on/off switch adapted to control functionality of the integral system.

(XX) In any of the integral systems denoted as (LL) through (WW), the photovoltaic assembly may be adapted to releasably secure to an external docking station including a release mechanism and additional means for charging the battery of the photovoltaic assembly.

(YY) In the integral system denoted as (XX), the external docking station may be adapted to releasably secure a plurality of photovoltaic assemblies.

Changes may be made in the above methods and systems without departing from the scope hereof. It should thus be noted that the matter contained in the above description or shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A reversible system for housing a battery-operated device, comprising:
    a first case member for housing the battery-operated device, the first case member including at least one first alignment member; and
    a second case member including:
        at least one second alignment member, and
        a reversible connector for physically and electrically connecting the second case member to a connector port of the battery-operated device in at least first and second orientations of the first case member with respect to the second case member, a screen of the battery-operated device facing outward at the first orientation, and the screen facing inward at the second orientation;
    wherein:
        the at least one first alignment member and the at least one second alignment member are adapted to releasably secure the first case member to the second case member in at least the first and second orientations, and
        the at least one first alignment member and the at least one second alignment member complement each other when the first case member is releasably secured to the second case member.

2. The reversible system of claim 1, wherein the at least one first alignment member is symmetrical along an elongated axis of a side of the first case member.

3. The reversible system of claim 2, wherein:
the at least one first alignment member comprises a groove along the side of the first case member;
the at least one second alignment member comprises a tab; and
the first and second case members are configured such that the tab is disposed in the groove when the first case member is joined to the second case member.

4. The reversible system of claim 1, each of the first and second case members comprising at least one aperture to enable access to at least one feature of the battery-operated device.

5. The reversible system of claim 1, the second case member further comprising:
a battery; and
a processor for controlling transfer of power from the battery to the battery-operated device;
wherein the reversible connector is adapted to interface the battery with the battery-operated device.

6. The reversible system of claim 5, wherein the battery comprises a rechargeable battery.

7. The reversible system of claim 6, the second case member further comprising at least one photovoltaic module for charging the battery.

8. The reversible system of claim 7, the at least one photovoltaic module comprising a plurality of monolithically integrated, thin film, photovoltaic cells.

9. A reversible system for housing a battery-operated device, comprising:
a first case member for housing the battery-operated device, the first case member including at least one first alignment member;
a second case member including at least one second alignment member and at least one second case member connector port; and
a connector adapter configured to be disposed in the at least one second case member connector port to connect the second case member to a connector port of the battery operated device, the connector adapter being separable from the second case member;
wherein:
the at least one first alignment member and the at least one second alignment member are adapted to releasably secure the first case member to the second case member,
the at least one first alignment member and the at least one second alignment member complement each other when the first case member is releasably secured to the second case member, and
the connector adapter is adapted to be disposed within the at least one second case member connector port in at least two different orientations, to connect the second case member to the connector port of the battery operated device in at least first and second orientations of the first case member with respect to the second case member, a screen of the battery-operated device facing outward at the first orientation, and the screen facing inward at the second orientation.

* * * * *